(12) United States Patent
Zhang et al.

(10) Patent No.: US 10,910,866 B2
(45) Date of Patent: Feb. 2, 2021

(54) CHARGING SYSTEM AND CHARGING METHOD FOR TERMINAL AND POWER ADAPTER

(71) Applicant: GUANGDONG OPPO MOBILE TELECOMMUNICATIONS CORP., LTD., Dongguan (CN)

(72) Inventors: Jialiang Zhang, Dongguan (CN); Shiming Wan, Dongguan (CN); Jun Zhang, Dongguan (CN); Chen Tian, Dongguan (CN); Shebiao Chen, Dongguan (CN); Jiada Li, Dongguan (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 539 days.

(21) Appl. No.: 15/563,594

(22) PCT Filed: Jan. 10, 2017

(86) PCT No.: PCT/CN2017/070728
§ 371 (c)(1),
(2) Date: Oct. 1, 2017

(87) PCT Pub. No.: WO2017/133410
PCT Pub. Date: Aug. 10, 2017

(65) Prior Publication Data
US 2018/0090977 A1    Mar. 29, 2018

Related U.S. Application Data

(63) Continuation-in-part of application No. PCT/CN2016/073679, filed on Feb. 5, 2016.

(30) Foreign Application Priority Data

Jul. 26, 2016 (CN) .......................... 2016 1 0600612

(51) Int. Cl.
*H02J 7/02* (2016.01)
*G01R 31/3842* (2019.01)
(Continued)

(52) U.S. Cl.
CPC .......... *H02J 7/027* (2013.01); *G01R 31/3842* (2019.01); *H01M 10/0525* (2013.01);
(Continued)

(58) Field of Classification Search
CPC ...................................................... H02J 7/02
See application file for complete search history.

(56) References Cited

U.S. PATENT DOCUMENTS 4,087,733 A    5/1978  Casagrande
5,905,364 A    5/1999  Ookita
(Continued)

FOREIGN PATENT DOCUMENTS

CN    1228637 A    9/1999
CN    1564421 A    1/2005
(Continued)

OTHER PUBLICATIONS

Did I miss something—both your "Resp to Arg" and RFA reference clm 1 (and 2 & 4) but these claims appear to be cancelled? translation , Fujita, 12, Dec. 2012.*
(Continued)

*Primary Examiner* — Drew A Dunn
*Assistant Examiner* — Tynese V McDaniel

(57) ABSTRACT

A charging system for a terminal, a charge method, and a power adapter are provided. The charging system includes a power adapter and a terminal. The power adapter includes a switch circuit, a second rectifying circuit, a first charging interface, and a control circuit. The control circuit modulates a duty cycle of a control signal based on voltage sampling value or current sampling value sampled by the sampling
(Continued)

circuit so that voltage in a third pulsating waveform output by the second rectifying circuit satisfies a charging requirement. The terminal includes a battery and a second charging interface connected to the battery. The second charging interface applies the voltage in the third pulsating waveform to the battery when the second charging interface is connected to the first charging interface, so that the pulsating waveform output by the power adapter is directly applied on the battery.

19 Claims, 20 Drawing Sheets

(51) Int. Cl.
| | |
|---|---|
| H02M 3/335 | (2006.01) |
| H02J 7/00 | (2006.01) |
| H02J 7/04 | (2006.01) |
| H02M 7/217 | (2006.01) |
| H02J 7/06 | (2006.01) |
| H02M 1/08 | (2006.01) |
| H02M 7/06 | (2006.01) |
| H01M 10/0525 | (2010.01) |
| H01M 10/42 | (2006.01) |
| H01M 10/44 | (2006.01) |
| H02M 1/44 | (2007.01) |
| H02M 5/04 | (2006.01) |
| H02M 7/04 | (2006.01) |
| H02J 7/24 | (2006.01) |
| H02M 1/00 | (2006.01) |
| H02J 7/10 | (2006.01) |

(52) U.S. Cl.
CPC ......... *H01M 10/425* (2013.01); *H01M 10/44* (2013.01); *H02J 7/00* (2013.01); *H02J 7/007* (2013.01); *H02J 7/008* (2013.01); *H02J 7/0029* (2013.01); *H02J 7/0031* (2013.01); *H02J 7/0071* (2020.01); *H02J 7/00711* (2020.01); *H02J 7/00712* (2020.01); *H02J 7/00714* (2020.01); *H02J 7/007188* (2020.01); *H02J 7/007192* (2020.01); *H02J 7/02* (2013.01); *H02J 7/022* (2013.01); *H02J 7/04* (2013.01); *H02J 7/045* (2013.01); *H02J 7/06* (2013.01); *H02M 1/08* (2013.01); *H02M 1/44* (2013.01); *H02M 3/335* (2013.01); *H02M 3/33507* (2013.01); *H02M 3/33523* (2013.01); *H02M 3/33569* (2013.01); *H02M 3/33576* (2013.01); *H02M 3/33592* (2013.01); *H02M 5/04* (2013.01); *H02M 7/04* (2013.01); *H02M 7/06* (2013.01); *H02M 7/217* (2013.01); *H01M 10/4257* (2013.01); *H01M 2010/4271* (2013.01); *H02J 7/00034* (2020.01); *H02J 7/00036* (2020.01); *H02J 7/0042* (2013.01); *H02J 7/00043* (2020.01); *H02J 7/0047* (2013.01); *H02J 7/0049* (2020.01); *H02J 7/00304* (2020.01); *H02J 7/2434* (2020.01); *H02J 2007/10* (2013.01); *H02J 2207/10* (2020.01); *H02J 2207/20* (2020.01); *H02M 2001/0009* (2013.01)

(56) References Cited

U.S. PATENT DOCUMENTS

| | | | |
|---|---|---|---|
| 5,945,811 A | 8/1999 | Hasegawa | |
| 5,991,167 A | 11/1999 | Van Lerberghe | |
| 6,025,695 A | 2/2000 | Friel et al. | |
| 6,075,340 A | 6/2000 | Koenck | |
| 6,137,265 A | 10/2000 | Cummings et al. | |
| 6,909,617 B1 | 6/2005 | Mirskiy | |
| 7,999,517 B2 | 8/2011 | Arai et al. | |
| 9,158,325 B1* | 10/2015 | Lim | G05F 5/00 |
| 9,473,032 B2 | 10/2016 | Sims | |
| 9,559,538 B1 | 1/2017 | Bonte | |
| 9,866,229 B2 | 1/2018 | Huang | |
| 9,997,946 B2 | 6/2018 | Kogler | |
| 2004/0090209 A1 | 5/2004 | Nishida et al. | |
| 2004/0263119 A1* | 12/2004 | Meyer | H02J 7/0022 320/116 |
| 2005/0225304 A1 | 10/2005 | Vieira Formenti | |
| 2006/0267553 A1 | 11/2006 | Chuang | |
| 2006/0284595 A1 | 12/2006 | Hsieh et al. | |
| 2007/0053212 A1 | 3/2007 | Vieira Formenti | |
| 2007/0076443 A1* | 4/2007 | Yasumura | H02M 3/33569 363/16 |
| 2007/0216359 A1 | 9/2007 | Arai | |
| 2007/0222416 A1* | 9/2007 | Sato | H02J 7/045 320/128 |
| 2008/0130336 A1* | 6/2008 | Taguchi | H02M 1/4225 363/125 |
| 2008/0197811 A1 | 8/2008 | Hartular et al. | |
| 2009/0001937 A1 | 1/2009 | Densham | |
| 2010/0090647 A1 | 4/2010 | Umetsu | |
| 2010/0202159 A1 | 8/2010 | Sims | |
| 2010/0231174 A1 | 9/2010 | Li et al. | |
| 2011/0057605 A1 | 3/2011 | Chung | |
| 2011/0101910 A1 | 5/2011 | Li et al. | |
| 2012/0075891 A1* | 3/2012 | Zhang | H02M 3/335 363/21.18 |
| 2012/0262950 A1 | 10/2012 | Nate | |
| 2013/0009593 A1 | 1/2013 | Takahashi et al. | |
| 2013/0141034 A1 | 6/2013 | Huang et al. | |
| 2014/0028250 A1 | 1/2014 | Nishino | |
| 2014/0159641 A1 | 6/2014 | Geren | |
| 2014/0195065 A1 | 7/2014 | Yang | |
| 2014/0368159 A1 | 12/2014 | Han | |
| 2015/0180356 A1* | 6/2015 | Norisada | H02M 3/3353 363/17 |
| 2015/0260801 A1 | 9/2015 | Trent et al. | |
| 2015/0263638 A1 | 9/2015 | Yang | |
| 2016/0046196 A1 | 2/2016 | Baek | |
| 2016/0056651 A1 | 2/2016 | Von Novak, III | |
| 2016/0072376 A1 | 3/2016 | Ahlers et al. | |
| 2016/0221455 A1 | 8/2016 | Ando et al. | |
| 2016/0233713 A1 | 8/2016 | Cheng | |
| 2016/0359403 A1* | 12/2016 | Werner | H02M 3/33523 |
| 2017/0005503 A1 | 1/2017 | Kogler | |
| 2017/0018940 A1 | 1/2017 | Zhang | |
| 2017/0187200 A1 | 6/2017 | Somerville et al. | |
| 2017/0207645 A1 | 7/2017 | Cohen | |
| 2017/0250557 A1 | 8/2017 | Zhang et al. | |
| 2017/0264204 A1 | 9/2017 | Motoki | |
| 2017/0293335 A1 | 10/2017 | Dunstan | |
| 2018/0183340 A1 | 6/2018 | Waters | |
| 2018/0214971 A1 | 8/2018 | Ihde | |

FOREIGN PATENT DOCUMENTS

| | | |
|---|---|---|
| CN | 1897394 A | 1/2007 |
| CN | 101051701 A | 10/2007 |
| CN | 202026118 U | 11/2011 |
| CN | 102545360 A | 7/2012 |
| CN | 102916595 A | 2/2013 |
| CN | 102957193 A | 3/2013 |
| CN | 103001272 A | 3/2013 |
| CN | 102364856 B | 10/2013 |
| CN | 101938154 B | 11/2013 |
| CN | 103762702 A | 4/2014 |
| CN | 103795040 A | 5/2014 |
| CN | 203747451 U | 7/2014 |
| CN | 203981764 U | 12/2014 |
| CN | 104810877 A | 7/2015 |
| CN | 104810879 A | 7/2015 |
| CN | 104917271 A | 9/2015 |
| CN | 104967199 A | 10/2015 |

(56) References Cited

FOREIGN PATENT DOCUMENTS

| | | | |
|---|---|---|---|
| CN | 104967201 A | 10/2015 | |
| CN | 105098900 A | 11/2015 | |
| CN | 204858705 U | 12/2015 | |
| CN | 105472827 A | 4/2016 | |
| CN | 106026327 A | 10/2016 | |
| CN | 106028327 A | 10/2016 | |
| CN | 106100083 A | 11/2016 | |
| CN | 205882810 U | 1/2017 | |
| CN | 205883072 U | 1/2017 | |
| CN | 106100083 A | 11/2018 | |
| EP | 2228884 A2 | 9/2010 | |
| EP | 2887492 A2 | 6/2015 | |
| EP | 2930589 A1 | 10/2015 | |
| EP | 2980958 A1 | 2/2016 | |
| JP | S61244267 A | 10/1986 | |
| JP | S6289431 A | 4/1987 | |
| JP | S63184073 A | 7/1988 | |
| JP | S63187321 A | 8/1988 | |
| JP | H01197998 A | 8/1989 | |
| JP | H03189569 A | 8/1991 | |
| JP | H04-138506 A | 5/1992 | |
| JP | H105103430 A | 4/1993 | |
| JP | H06-165407 A | 6/1994 | |
| JP | H07177672 * | 7/1995 | |
| JP | H107177672 A | 7/1995 | |
| JP | H09233725 A | 9/1997 | |
| JP | 2000275282 A | 10/2000 | |
| JP | 2002027758 A | 1/2002 | |
| JP | 2002262565 A | 9/2002 | |
| JP | 2005151740 A | 6/2005 | |
| JP | 2005530468 A | 10/2005 | |
| JP | 2010011563 A | 1/2010 | |
| JP | 2010093965 A | 4/2010 | |
| JP | 2010-263735 A | 11/2010 | |
| JP | 2011205839 A | 10/2011 | |
| JP | 2012070510 * | 1/2012 | |
| JP | 2012070510 A | 4/2012 | |
| JP | 2012090480 A | 5/2012 | |
| JP | 2012249409 A | 12/2012 | |
| JP | 2012249410 A | 12/2012 | |
| JP | 2012249410 A * | 12/2012 | ............. B60L 3/003 |
| JP | 2013093952 A | 5/2013 | |
| JP | 2013198262 A | 9/2013 | |
| JP | 5454781 B2 | 3/2014 | |
| JP | 2014053992 A | 3/2014 | |
| JP | 2014053992 A * | 3/2014 | |
| JP | 3198222 U | 6/2015 | |
| JP | 5822304 B2 | 10/2015 | |
| JP | 2016063622 A | 4/2016 | |
| TW | 200616305 A | 5/2006 | |
| TW | M481439 U | 7/2014 | |
| WO | 2008125790 A1 | 10/2008 | |
| WO | 2012167677 A1 | 12/2012 | |
| WO | 2015113341 A1 | 8/2015 | |
| WO | 2015113349 A1 | 8/2015 | |
| WO | 2016043099 A1 | 3/2016 | |

OTHER PUBLICATIONS

JP2014053992A, treanslation, Haga, Mar. 2014.*
JP 2012070510 translation, Sugira, 2012.*
Jul. 1995, JPH07177672 translation Yamazaki.*
Liang-Rui Chen, 'A Design of an Optimal Battery Pulse Charge System by Frequency-Varied Technique', IEEE Transactions on Industrial Electronics, vol. 54, No. 1, Feb. 2007, pp. 398-405.
Office Action issued in corresponding EP application No. 177467305 dated Jun. 28, 2019.
Office Action issued in corresponding IN application No. 201737041040 dated Sep. 4, 2019.
Office Action 1 issued in corresponding Australia application No. 2017215264 dated Aug. 27, 2018.
First Examination Report issued in corresponding IN application No. 201717041237 dated Oct. 23, 2019.
Second Written Opinion issued in corresponding SG application No. 11201801422U dated Sep. 18, 2019.
English Translation of Office Action issued in corresponding IN application No. 201737041041 dated Dec. 27, 2019.
The First Office Action and English Translation issued in corresponding CN application No. 201680001814.4 dated Sep. 3, 2018.
Communication pursuant to Article 94(3) EPC issued in corresponding European application No. 16819788.7 dated Mar. 5, 2020.
Notice of Reasons for Refusal and English Translation issued in corresponding JP application No. 2017-514512 dated Sep. 4, 2018.
Notice of allowance and English Translation issued in corresponding KR application No. 10-2017-7002310 dated Aug. 24, 2018.
Non final rejection issued in corresponding U.S. Appl. No. 15/406,017 dated Jun. 27, 2019.
Final rejection issued in corresponding U.S. Appl. No. 15/406,017 dated Oct. 31, 2019.
Non final rejection issued in corresponding U.S. Appl. No. 15/406,017 dated Feb. 5, 2020.
Final rejection issued in corresponding U.S. Appl. No. 15/406,017 dated Jun. 24, 2020.
Office action and English Translation issued in corresponding KR application No. 10-2018-7006369 dated Jun. 19, 2020.
Notice of Reasons for Refusal and English Translation issued in corresponding JP application No. 2019-097976 dated Aug. 28, 2020.
The Second Office Action and English Translation issued in corresponding CN application No. 201680001814.4 dated Apr. 17, 2019.
The first Office Action and English Translation issued in corresponding CN application No. 201780001996.X dated Jun. 29, 2020.
Communication pursuant to Article 94(3) EPC issued in corresponding European Application No. 17746704.0, dated Feb. 8, 2019.
Examination report and English Translation issued in corresponding Indonesia Application No. P00201700960, dated Jul. 5, 2019.
Examination report issued in corresponding IN Application No. 201737001350, dated Mar. 12, 2019.
Examination report issued in corresponding IN Application No. 201737046880, dated Jan. 22, 2020.
Notice of Reasons for Refusal and English Translation issued in corresponding JP Application No. 2018-504669, dated Oct. 16, 2018.
Non final rejection issued in corresponding U.S. Appl. No. 15/563,594, dated Mar. 18, 2020.
Notice of Reasons for Refusal and English Translation issued in corresponding JP Application No. 2018-513611, dated Sep. 12, 2018.
Examination Report issued in corresponding SG Application No. 11201801422U, dated Sep. 3, 2020.
The first Office Action and English Translation issued in corresponding CN application No. 201780001362.4 dated Sep. 15, 2020.

* cited by examiner

CHARGING SYSTEM AND CHARGING METHOD FOR TERMINAL AND POWER ADAPTER

CROSS REFERENCE TO RELATED APPLICATION

This application is a US national phase application based upon an International Application No, PCT/CN2017/070728, filed on Jan. 10, 2017, which claims priority to Chinese Application No, 201610600612.3, filed on Jul. 26, 2016 and international Application No. PCT/CN2016/073679, filed on Feb. 5, 2016. The entire disclosures of the above applications are incorporated herein by reference.

BACKGROUND

1. Field of Disclosure

The present disclosure relates to a terminal device technology, more particularly, to a charging system for a terminal, a charging method for the terminal, and a power adapter.

2. Description of Related Art

Currently, mobile terminals (such as a smart phone) are increasingly popular with consumers. However, the mobile terminals consume a great amount of power so that they need to be charged frequently.

The mobile terminals are usually charged through power adapters. A power adapter generally includes a primary rectifier circuit, a primary filter circuit, a transformer, a secondary rectifier circuit, a secondary filter circuit, and a control circuit, etc. The power adapter converts input 220V alternating current (AC) power into a stable low-voltage direct current (DC) power (such as 5V) suitable for the mobile terminal, so as to provide power to a power management device and a battery of the mobile terminal, thus charging the mobile terminal.

However, as the power of the power adapters increases, for example, when the power is upgraded from 5 W to a higher power, such as 10 W, 15 W, 25 W etc., more electronic components that can sustain a higher power and realize a higher control of accuracy are needed for complementing each other. This causes size of the power adapters to increase as well as manufacturing difficulty of the adapters to also increase.

SUMMARY

The present application is based on the inventor's knowledge and research on the following issues.

With the power of a power adapter becomes higher, the battery tends to polarize and the resistance tends to become larger when the power adapter charges the battery of the mobile terminal; the battery temperature thus rises to reduce the service life of the battery. As a result, the reliability and safety of the battery are affected.

In addition, when an AC power supplies power, most of the equipment cannot operate by directly using the AC power. The reason is that an AC power, such as 220V/50 Hz mains, outputs power intermittently; and in order not to be "intermittent", electrolytic capacitors need to be used for energy storage. When the power is at the wave trough, the power supply is maintained stably by continuously relying on the energy storage of electrolytic capacitors. Therefore, when a mobile terminal is charged by an AC power supply through a power adapter, the AC power, such as 220V AC power, provided by the AC power supply is first converted into a stable DC power be supplied to the mobile terminal. However, the power adapter charges the battery of the mobile terminal, thus indirectly supplying power to the mobile terminal. The continuity of power supply can be ensured by the battery. As such, the power adapter does not need to continuously output a stable DC power when charging the battery.

One objective of the present disclosure is to provide a charging system for a terminal so as to realize a miniaturized and low-cost power adapter.

Another objective of the present disclosure is to provide a power adapter. Still another objective of the present disclosure is to provide a charging method for a terminal.

In order to achieve at least one of the above objectives, one aspect of the present disclosure provides a charging system for a terminal. The charging system for the terminal includes a power adapter and a terminal. The power adapter includes a first rectifying circuit and a second rectifying circuit. The first rectifying circuit rectifies an input AC power to output voltage in a first pulsating waveform during a charging process. The second rectifying circuit rectifies voltage coupled from a primary side to a secondary side. A waveform of a current output after being rectified by the second rectifying circuit has a same period as the first pulsating waveform. Or an envelope of the waveform of the current output after being rectified by the second rectifying circuit has a same period as the first pulsating waveform. The terminal charges a battery in the terminal based on an output voltage of the power adaptor.

In the embodiment of the present disclosure, the power adapter omits the liquid aluminum electrolytic capacitors on the primary side for rectifying. As a result, the first rectifying circuit directly outputs the voltage in the pulsating waveform so as to reduce the volume of the adapter. In addition, since the service life of the liquid aluminum electrolytic capacitors on the primary side is shorter and the liquid aluminum electrolytic capacitors blast easily, omission of the liquid aluminum electrolytic capacitors on the primary side can greatly improve the service life and safety of the adapter.

In order to achieve at least one of the above objectives, another aspect of the present disclosure provides a power adapter. The power adapter includes a first rectifying circuit and a second rectifying circuit. The first rectifying circuit rectifies an input AC power to output voltage in a first pulsating waveform during a charging process. The second rectifying circuit rectifies voltage coupled from a primary side to a secondary side. A waveform of a current output after being rectified by the second rectifying circuit has a same period as the first pulsating waveform. Or an envelope of the waveform of the current output after being rectified by the second rectifying circuit has a same period as the first pulsating waveform.

In the embodiment of the present disclosure, the power adapter omits the liquid aluminum electrolytic capacitors on the primary side for rectifying. As a result, the first rectifying circuit directly outputs the voltage in the pulsating waveform so as to reduce the volume of the adapter. In addition, since the service life of the liquid aluminum electrolytic capacitors on the primary side is shorter and the liquid aluminum electrolytic capacitors blast easily, omission of the liquid aluminum electrolytic capacitors on the primary side can greatly improve the service life and safety of the adapter.

In order to achieve at least one of the above objectives, still another aspect of the present disclosure provides a charging method for a terminal. The charging method for the terminal includes the following blocks. An input AC power is rectified for the first time to output voltage in a first pulsating waveform during a charging process. Voltage coupled from a primary side to a secondary side is rectified for the second time. A waveform of a current output after being rectified by the second rectifying circuit has a same period as the first pulsating waveform. Or an envelope of the waveform of the current output after being rectified by the second rectifying circuit has a same period as the first pulsating waveform.

In the embodiment of the present disclosure, the power adapter omits the liquid aluminum electrolytic capacitors on the primary side for rectifying. As a result, the first rectifying circuit directly outputs the voltage in the pulsating waveform so as to reduce the volume of the adapter. In addition, since the service life of the liquid aluminum electrolytic capacitors on the primary side is shorter and the liquid aluminum electrolytic capacitors blast easily, omission of the liquid aluminum electrolytic capacitors on the primary side can greatly improve the service life and safety of the adapter.

DESCRIPTION OF THE EMBODIMENTS

Figure 1A:
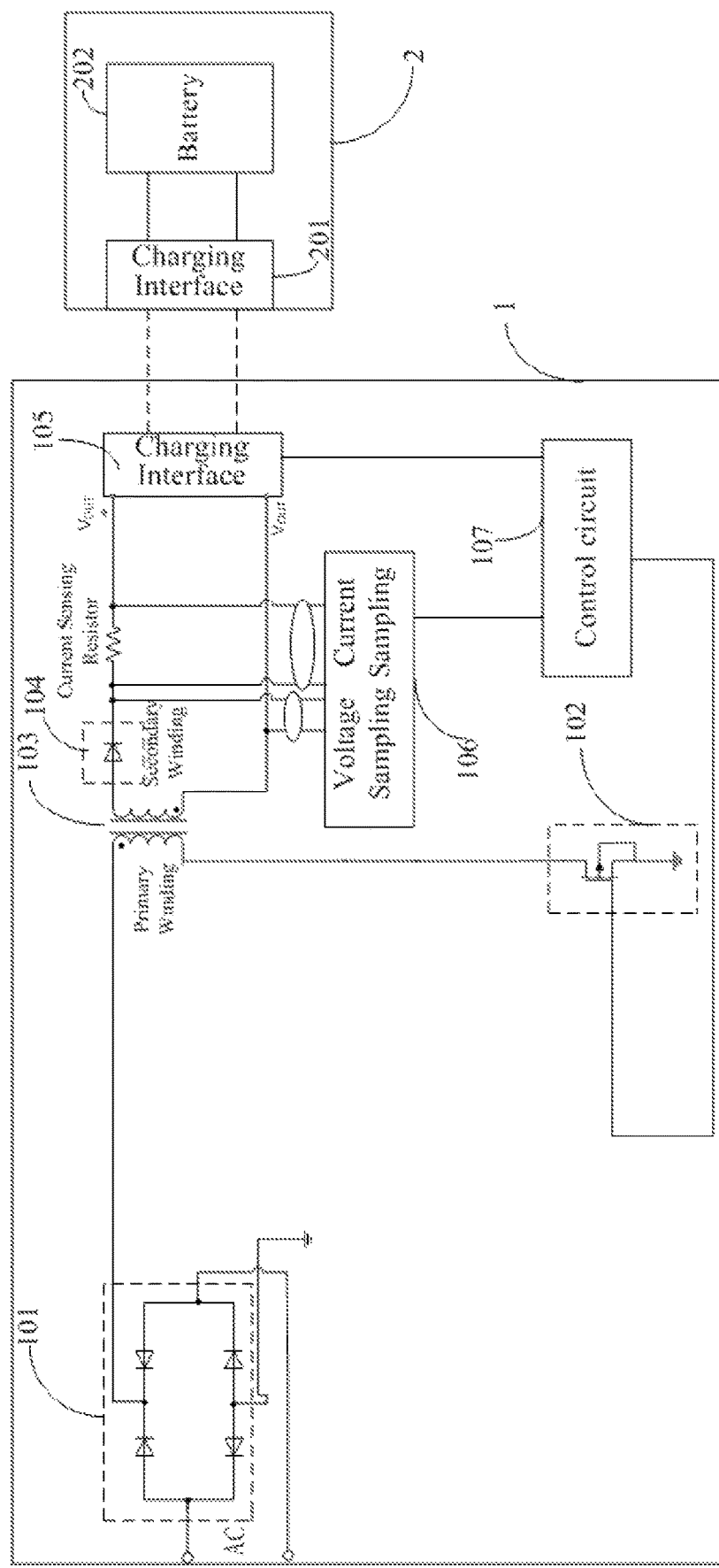
FIG. 1A illustrates a block schematic diagram of a charging system for a terminal that adopts a flyback switching power supply according to one embodiment of the present disclosure.

Embodiments of the present application are illustrated in detail in the accompanying drawings, in which like or similar reference numerals refer like or similar elements or elements having the same or similar functions throughout the specification. The embodiments described below with reference to the accompanying drawings are exemplary and are intended to be illustrative of the present application, and are not to be construed as limiting the scope of the present application.

Before a charging system and a charging method for a terminal and a power adapter according to the embodiments of the present disclosure are provided, description of a power adapter for charging a chargeable device (e.g. a terminal), that is, an "associated adapter" as called in the following, in the relevant technology is first described.

The associated adapter constantly maintains an output voltage when the associated adapter operates in a constant voltage mode, such as 5V, 9V, 12V, or 20V, etc.

Voltage output from the associated adapter is not suitable to be directly applied to two terminals of a battery, rather, the voltage output from the associated adapter needs to be first converted through a converter circuit in a chargeable device (such as a terminal) so as to obtain an expected charging voltage and/or a charging current by a battery in the chargeable device (such as a terminal). The charging current may be DC current.

The converter circuit is configured to convert the voltage output from the associated adapter so as to satisfy the expected requirement of the charging voltage and/or the charging current by the battery.

As an example, the converter circuit may refer to a charging management module, such as a charging IC in the terminal, which is configured to manage the charging voltage and/or the charging circuit of the battery during the charging process of the battery. The converter circuit has a function of a voltage feedback module and/or a function of a current feedback module to manage the charging voltage and/or the charging circuit of the battery.

For example, the charging process of the battery may include at least one of a trickle charging stage, a constant current charging stage, and a constant voltage charging stage. During the trickle charging stage, the converter circuit can utilize a current feedback loop so that a current entering into the battery satisfies a magnitude of the charging current expected by the battery (such as a first charging current) in the trickle charging stage. During the constant current charging stage, the converter circuit can utilize the current feedback loop so that the current entering into the battery satisfies magnitude of the charging current expected by the battery (such as a second charging current, the second charging current may be greater than the first charging current) in the constant current charging stage. During the constant voltage charging stage, the converter circuit can utilize a voltage feedback loop so that voltage applied to the two terminals of the battery satisfies a magnitude of the charging voltage expected by the battery in the constant voltage charging stage.

As an example, when the voltage output from the associated adapter is greater than the charging voltage expected by the battery, the converter circuit can be configured to step down the voltage output from the associated adapter so that the charging voltage obtained after buck conversion satisfies the charging voltage expected by the battery. As another example, when the voltage output from the associated adapter is less than the charging voltage expected by the battery, the converter circuit can be configured to boost the voltage output from the associated adapter so that the charging voltage obtained after the boost conversion satisfies the charging voltage expected by the battery.

In yet another example, a constant 5V voltage output from the associated adapter is taken as an example. When the battery includes a single cell (take a lithium battery cell for example, a charging cut-off voltage of a single cell is 4.2V), the converter circuit (such as a buck circuit) can step down the voltage output from the associated adapter so that the charging voltage obtained after bucking satisfies the charging voltage expected by the battery.

In yet another example, the constant voltage of 5V output from the associated adapter is taken as an example. When the battery is a battery having two or more than two single cells (take the lithium battery cell for example, the charging cut-off voltage of the single cell is 4.2V) connected in series, the converter circuit (such as a boost circuit) can boost the voltage output from the associated adapter so that the charging voltage obtained after boosting satisfies the charging voltage expected by the battery.

Because the converter circuit is limited by low conversion efficiency of the circuit, electrical energy that is not converted, is dissipated in a form of heat. This heat will accumulate inside the chargeable device (such as the terminal), where a design space and a heat dissipation space of the chargeable device (such as the terminal) are both limited (for example, a physical size of a mobile terminal used by a user becomes increasingly thin and light, and a great number of electronic components are closely arranged inside the mobile terminal to enhance performance of the mobile terminal). Not only does it create increased difficulty of designing the converter circuit, but also it is very difficult to dissipate heat accumulated inside the chargeable device (such as the terminal) in a timely manner, thus causing the chargeable device (such as the terminal) to become abnormal.

For example, heat accumulated by the converter circuit is likely to cause thermal interference with electronic components near the converter circuit so that the electronic components work abnormally; and/or, for example, the heat accumulated on the converter circuit is likely to shorten service lives of the converter circuit and the electronic components nearby; and/or, for example, the heat accumulated on the converter circuit is likely to cause thermal interference with the battery so that the battery charges and discharges abnormally; and/or, for example, the heat accumulated on the converter circuit is likely to raise temperature of the chargeable device such as the terminal) so that the user experience is affected when the user charges; and/or, for example, the heat accumulated on the converter circuit is likely to cause a short circuit of the converter circuit itself so that the battery charges abnormally when the voltage output from the associated adapter is directly applied to the two terminals of a battery. Under the circumstances that the battery is over charged for a long time, the battery can even explode, which in turn causes a certain security concern.

A power adapter according to the embodiment of the present disclosure can acquire battery stale information. The battery state information at least includes a current battery level information and/or voltage information. The power adapter adjusts an output voltage of the power adapter itself based on the acquired battery state information to satisfy a charging voltage and/or a charging current expected by the battery. Voltage outputted by the power adapter after adjustment can be directly applied to two terminals of the battery to charge the battery (hereinafter referred to as "direct charge"). In some embodiments, an output of the power adapter may be voltage in a pulsating waveform.

The power adapter has functions of a voltage feedback module and a current feedback module, to achieve the management of the charging voltage and/or the charging circuit of the battery.

The power adapter adjusting the output voltage of the power adapter itself based on the acquired battery state information may refer to the power adapter can acquire the battery state information in a real-time manner and adjust the voltage output from the power adapter itself based on real-time state information of the battery acquired every time, to satisfy the charging voltage and/or the charging current expected by the battery.

The power adapter adjusting the output voltage of the power adapter itself based on the battery state information acquired in a real-time manner may refer to the power adapter can acquire current state information of the battery at different times during a charging process as the charging voltage of the battery continues to rise during the charging process, and adjust the output voltage of the power adapter itself based on the current state information of the battery in a real-time manner to satisfy the charging voltage and/or the charging current expected by the battery. The voltage output from the power adapter after adjustment can be directly applied to the two terminals of the battery to charge the battery.

For example, the charging process of the battery may include at least one of a trickle charging stage, a constant current charging stage, and a constant voltage charging stage. During the trickle charging stage, the power adapter can output a first charging current to charge the battery so as to satisfy the charging current expected by the battery (in some embodiments, the first charging current may be current in a pulsating waveform). During the constant current charging stage, the power adapter can utilize a current feedback loop so that a current output from the power adapter and enters into the battery satisfies the charging current expected by the battery (for example, a second charging current, the second charging current may similarly be a current in a pulsating waveform, the second charging current may be greater than the first charging current, a peak value of the current in the pulsating waveform of the constant current charging stage may be greater than a peak value of the current in the pulsating waveform of the trickle charging stage, and a constant current of the constant current charging stage may refer to the peak value or an average value of the current in the pulsating waveform basically remaining unchanged). During the constant voltage charging stage, the power adapter can utilize a voltage feedback loop so that voltage (that is, the voltage in the pulsating waveform) outputted from the power adapter to a piece of chargeable device (such as a terminal) in the constant voltage charging stage is maintained constantly.

For example, the power adapter according to the embodiment of the present disclosure can be mainly configured to control the constant current charging stage of the battery in the chargeable device (such as the terminal). In other embodiments, functions of controlling the trickle charging stage and the constant voltage charging stage of the battery in the chargeable device (such as the terminal) may be cooperatively achieved by the power adapter according to the embodiment of the present disclosure and an additional charging chip in the chargeable device (such as the terminal). When compared with the constant current charging stage, charging power received by the battery in the trickle charging stage and the constant voltage charging stage is less, the efficiency conversion loss and heat accumulation of the charging chip in the chargeable device (such as the terminal) are thus acceptable. It is noted that the constant current charging stage or the constant current stage according to the embodiment of the present disclosure may refer to the charging mode that controls an output current of the associated adapter and does not require that the output current of the power adapter to be maintained completely unchanged, for example, may refer to that the peak value or the average value of the current in the pulsating waveform output from the associated adapter basically remains unchanged or basically remains unchanged within a period of time. For example, in practice, the power adapter in the constant current charging stage usually uses a multi-stage constant current charging method to charge.

The multi-stage constant current charging may have N constant current stages (N is a positive integer not less than 2). The multi-stage constant current charging uses a predetermined charging current to start a first charging stage. The N constant current stages of the multi-stage constant current charging are sequentially executed from the first stage to the (N−1)th stage. After a previous constant current stage is changed to a next constant current stage in the constant current stages, the peak value or the average value of the current in the pulsating waveform can become smaller. When a battery voltage reaches a threshold voltage value for terminating charging, the previous constant current stage will change to the next constant current stage in the constant current stages. The current conversion process between two adjacent constant current stages may be gradual, or may be a stepped jump.

In addition, it is noted that the term "terminal" as used in the embodiments of the present disclosure may include, but is not limited to, a device configured to be connected via a wired connection (for example, via a public switched telephone network (PSTN), a digital subscriber line (DSL), a digital cable, a direct cable connection, and/or another data connection/network) and/or a device configured to receive/send a communication signal via a wireless interface (such as a cellular network, a wireless local area network (WLAN), a digital television network such as a DVB-H network, a satellite network, an AM-FM broadcast transmitter, and/or another communication terminal). A terminal configured to communicate via a wireless interface may be referred to as a "wireless communication terminal", a "wireless terminal", and/or a "mobile terminal" Examples of mobile terminal include, but are not limited to, a satellite or cell phone; a personal communication system (PCS) terminal that can combine a cellular radiotelephone, data processing, facsimile, and data communications capabilities; may include a radiotelephone, a pager, an Internet/Intranet access, a Web browser, an electronic organizer, a calendar, and/or a personal digital assistant (PDA) equipped with a global positioning System (GPS) receiver; and a common laptop and/or palm type receiver or some other electronic devices including a transmitter-receiver radiotelephone.

In addition, according to the embodiment of the present disclosure, when the voltage in the pulsating waveform output from the power adapter is directly applied to the battery of the terminal so as to charge the battery, the charging current is characterized by a pulsating wave, such as a clipped sine wave, and it is understood that the charging current charges the battery in an intermittent manner. A period of the charging current changes depending on an input AC power, such as a frequency of an AC grid. For example, a frequency corresponding to the period of the charging current is an integer multiple or a reciprocal of the frequency of the AC grid. Additionally, the charging current charges the battery in an intermittent manner. A current waveform corresponding to the charging current may be composed of one pulse or one group of pulses synchronized with the grid.

To serve as an example, according to the embodiment of the present disclosure, the battery can receive a pulsating direct current (direction unchanged, amplitude varying with time), an alternating current (both direction and amplitude varying with time), or a direct current (that is, a constant current, both amplitude and direction not varying with time) output from the power adapter during the charging process (such as at least one of the trickle charging stage, the constant current charging stage, and the constant voltage charging stage).

A primary side of the associated adapter includes a plurality of liquid aluminum electrolytic capacitors, and these liquid aluminum electrolytic capacitors have the following drawbacks. First, the liquid aluminum electrolytic capacitor is large, which results in a large volume of the associated adapter. Second, the liquid aluminum electrolytic capacitor is generally in a cylindrical shape, where the cylindrical shape occupies a large area of the circuit board, which results in the overall wiring difficulty of the circuit board inside the associated adapter. Third, service life of the liquid aluminum electrolytic capacitor is limited, which results in limited service life of the associated adapter. Fourth, the liquid aluminum electrolytic capacitor may explode, and the electrolyte flowing out after an explosion is a conductor, which results in a security concern of the adapter.

Figure 2A:
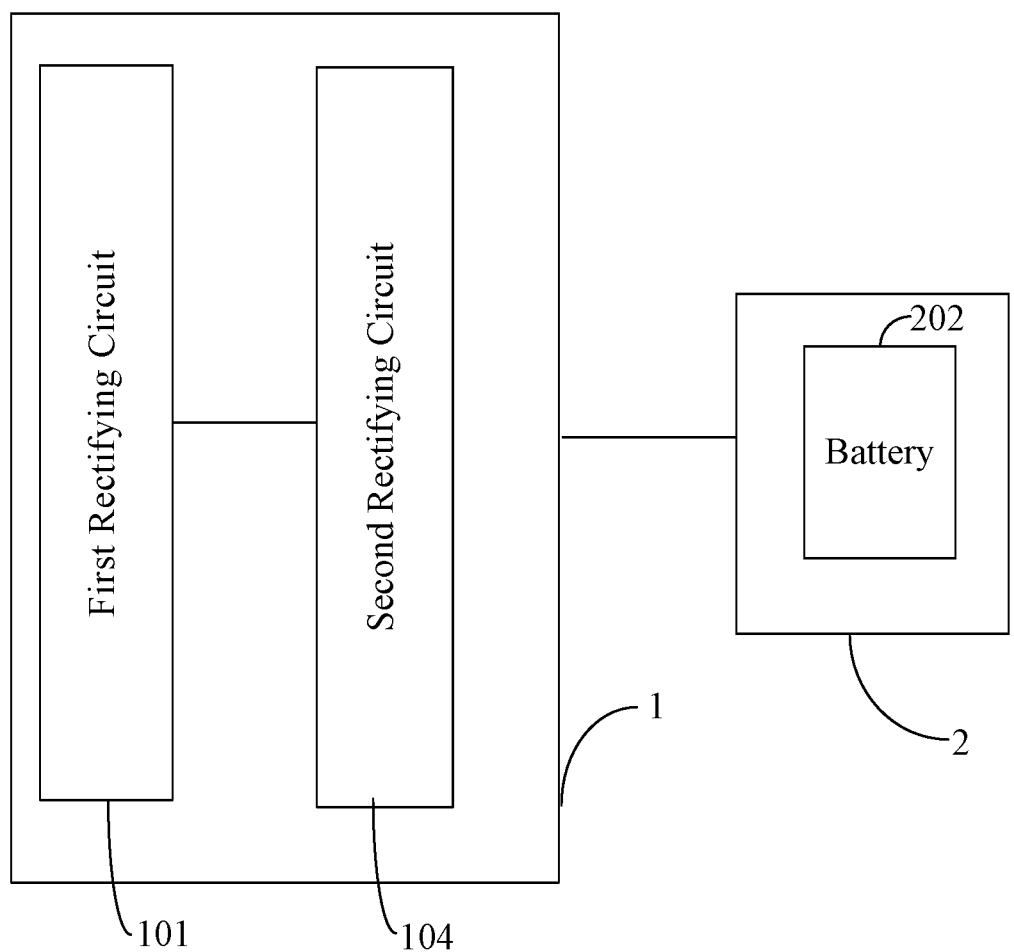
FIG. 2A illustrates a block schematic diagram of a charging system for a terminal according to one embodiment of the present disclosure.

In order to resolve at least one of the above problems, one embodiment of the present disclosure provides a charging system for a terminal including a power adapter 1 and a terminal 2, as shown in FIG. 2A.

The power adapter 1 includes a first rectifying circuit 101 and a second rectifying circuit 104.

The first rectifying circuit 101 is configured to rectify input AC power to output voltage in a first pulsating waveform during a charging process.

The second rectifying circuit 104 is configured to rectify voltage that is coupled from a primary side to a secondary side. A waveform of a current output after being rectified by the second rectifying circuit 104 has a same period as the first pulsating waveform. Or, an envelope of the waveform of the current output after being rectified by the second rectifying circuit 104 has a same period as the first pulsating waveform.

The terminal 2 charges a battery 202 in the terminal 2 based on an output voltage of the power adapter.

According to the embodiment of the present disclosure, the power adapter removes the liquid aluminum electrolytic capacitors on the primary side for rectifying. As a result, the first rectifying circuit directly outputs the voltage in the pulsating waveform so as to reduce a volume of the associated adapter. In addition, since the service life of the liquid aluminum electrolytic capacitors on the primary side is shorter and the liquid aluminum electrolytic capacitors explodes easily, removing the liquid aluminum electrolytic capacitors on the primary side can greatly improve service life and safety of the associated adapter.

The waveform of the current output after being rectified by the second rectifying circuit 104 having the same period as the first pulsating waveform may refer to that the waveform of the current output after being rectified by the second rectifying circuit 104 synchronizes with the first pulsating waveform.

The envelope of the waveform of the current output after being rectified by the second rectifying circuit 104 having the same period as the first pulsating waveform may refer to that the envelope of the waveform of the current output after being rectified by the second rectifying circuit 104 synchronizes with the first pulsating waveform.

Figure 16A:
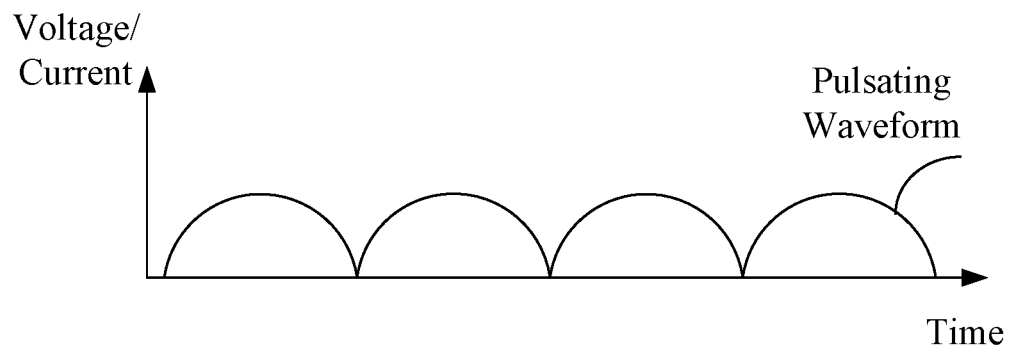
FIG. 16A and FIG. 16B illustrate pulsating waveforms according to embodiments of the present disclosure.
Figure 16B:
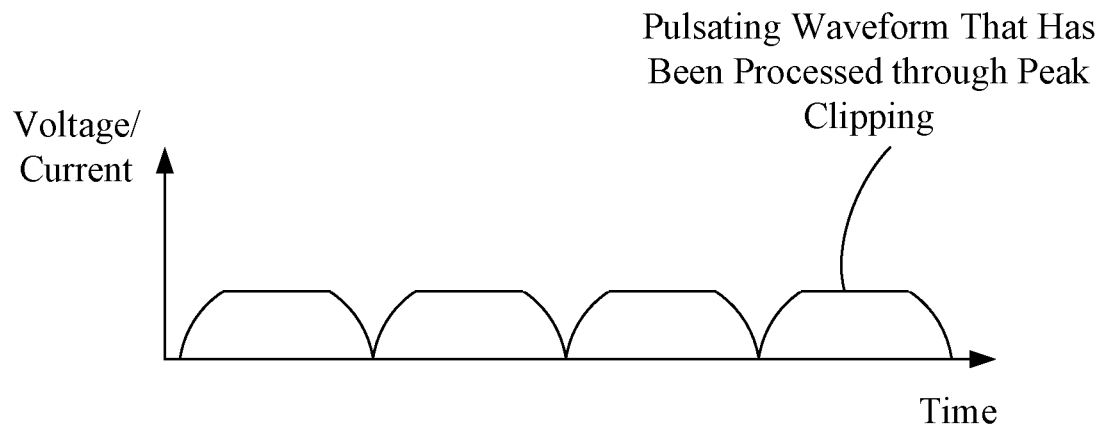

It should be understood that the waveform or a waveform envelope of the current output after being rectified by the second rectifying circuit 104 may be a complete pulsating waveform, or may be a pulsating waveform obtained after a peak clipping process (similar to a T shape, see FIG. 16B).

In some embodiments, a current output from the second rectifying circuit 104 may directly serve as an output current of the power adapter 1 to output. In some other embodiments, a current waveform or an envelope of the current waveform output from the second rectifying circuit 104 can be processed by various waveform conversion, and then a current obtained after the wave conversion serves as the output current of the power adapter 1. For example, a voltage waveform/current waveform output from the second rectifying circuit 104 can be converted into a waveform, such as a square wave, a triangular wave, etc., and a current in the square waveform or a current in the triangular waveform is then output. The current waveform may be varied in a variety of ways. For example, an element, such as a switch, a capacitor, etc., may be disposed after the second rectifying circuit 104 to change a shape of the current waveform output from the second rectifying circuit 104.

Similarly, voltage output from the second rectifying circuit 104 may directly serve as the output voltage of the power adapter 1. The voltage waveform or an envelope of the voltage waveform output from the second rectifying circuit 104 can be processed by various waveform conversion, and then voltage obtained after the wave conversion serves as the output voltage of the power adapter 1. A description of an example in which voltage in a third pulsating waveform is output from the power adapter 1 is provided as follows for illustration, but the embodiment of the present disclosure is not limited in this regard.

Figure 3:
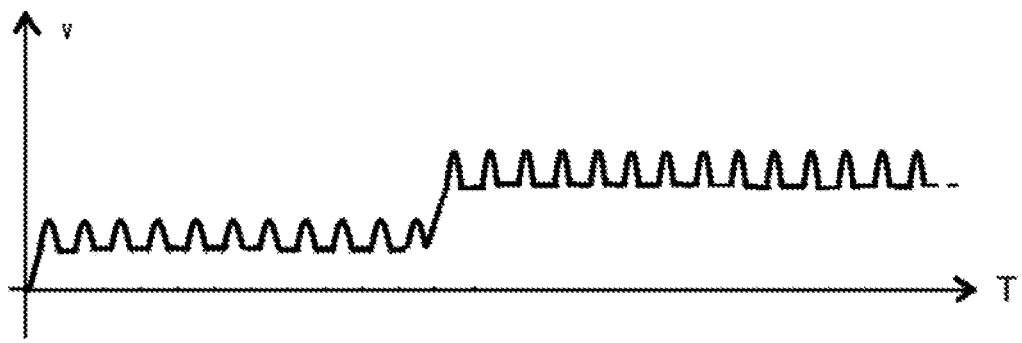
FIG. 3 illustrates a waveform of a charging voltage output to a battery from a power adapter according to one embodiment of the present disclosure.

It should be understood that the voltages in one or more pulsating waveforms described in the embodiment of the present disclosure may show a non-negative pulsating waveform (such as the first pulsating (waveform), or may show a positive and negative alternating pulsating waveform (such as a second pulsating waveform). In greater detail, the one or more pulsating waveforms described in the embodiment of the present disclosure may refer to that the waveforms are in a pulsating form when viewed from a macroscopic or overall trend. The pulsating waveforms may change continuously or discontinuously when viewed microscopically. For example, voltage in the second pulsating waveform and the voltage in the third pulsating waveform may be voltages obtained after a peak clipping process through a switch circuit 102. If a secondary filtering process is not performed, the second pulsating waveform or the third pulsating waveform may be formed by a combination of many small and discontinuous pulses when viewed microscopically. However, the waveforms of the voltages are still pulsating waveforms as a whole. Hence, in the embodiment of the present disclosure, the waveforms that are pulsating when viewed from an overall or macroscopic viewpoint are also called pulsating waveforms. In other words, the voltages in one or more pulsating waveforms described in the embodiment of the present disclosure may refer to that envelopes of the voltages are pulsating. In addition, the one or more pulsating waveforms in the embodiment of the present disclosure may be complete pulsating waveforms, or may be pulsating waveforms after a peak clipping process. For example, the voltage in the third pulsating waveform may show a complete pulsating waveform as shown in FIG. 16A, or may show a pulsating waveform after a peak clipping process as shown in FIG. 16B. Additionally, during the charging process, the voltage in the pulsating waveform is clamped by the voltage across two terminals of the battery. The one or more pulsation waveforms in the embodiment of the present disclosure may refer to a pulsation waveform formed after clamping (as shown in FIG. 3), for example, in the charging process, the voltage in the third pulsating waveform may show a pulsating waveform after clamping.

A description of a charging system for a terminal and a power adapter and a charging method for a terminal according to the embodiment of the present disclosure is provided as follows with reference to the figures.

A description is provided with reference to FIG. 1A to FIG. 14. A charging system for a terminal according to the embodiment of the present disclosure includes a power adapter 1 and a terminal 2.

Figure 2B:
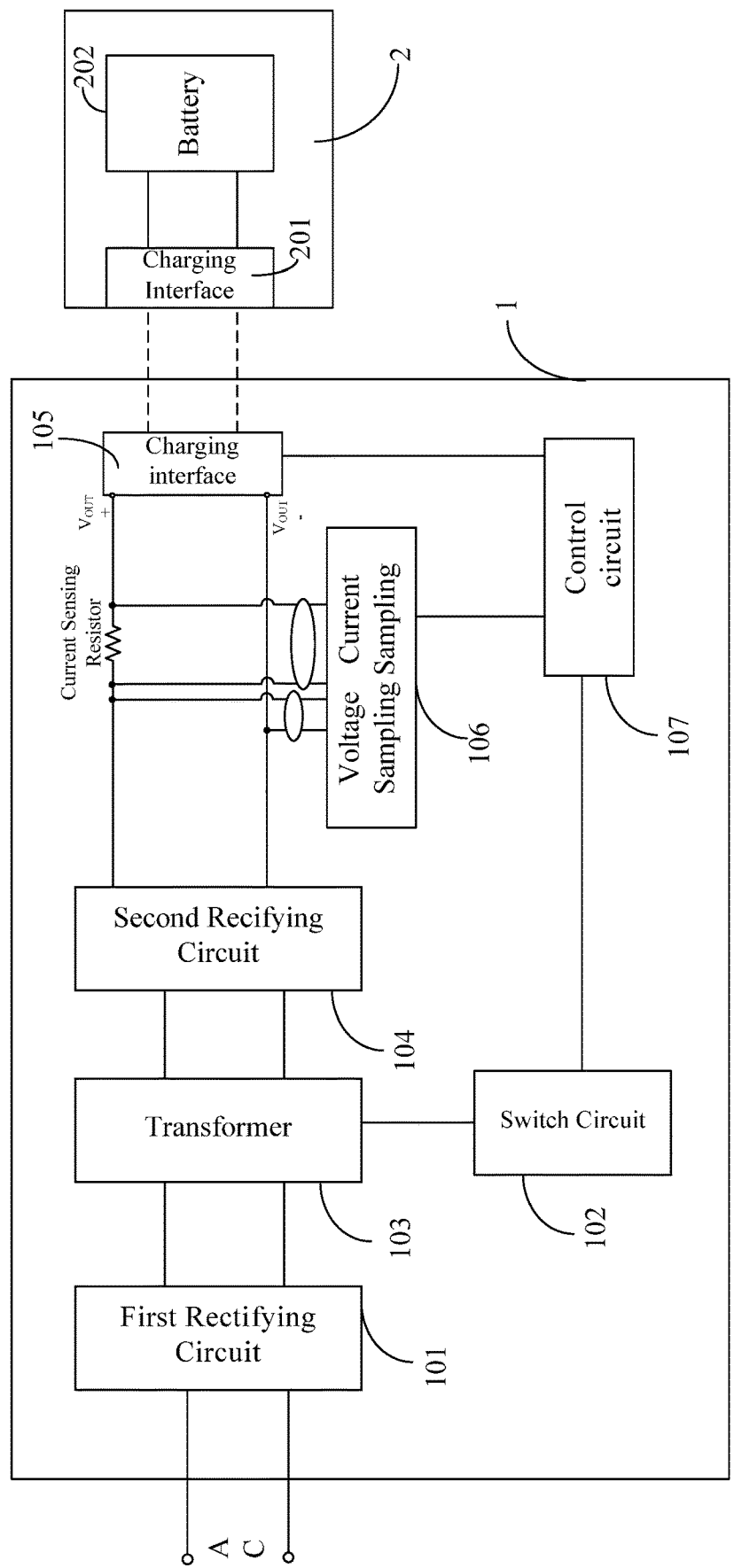
FIG. 2B illustrates a block schematic diagram of a charging system for a terminal according to another embodiment of the present disclosure.

As shown in FIG. 2B, the power adapter 1 includes a first rectifying circuit 101, a switch circuit 102, a transformer 103, a second rectifying circuit 104, a first charging interface 105, a sampling circuit 106, and a control circuit 107. The first rectifying circuit 101 rectifies an input AC power (mains, such as AC220V) to output voltage in a first pulsation waveform, such as a voltage in a clipped pulsating waveform. As shown in FIG. 1A, the first rectifying circuit 101 may be a full bridge rectifier circuit constituted by four diodes. The switch circuit 102 is configured to modulate the voltage in the first pulsating waveform based on a control signal. The switch circuit 102 may be constituted by a metal-oxide-semiconductor (MOS) transistor, and perform a peak clipping modulation to the voltage in the clipped pulsating waveform through performing a pulse width modulation (PWM) control to the transistor. The transformer 103 is configured to output voltage in a second pulsating form based on the voltage in the first pulsating form thus modulated. The second rectifying circuit 104 is configured to rectify the voltage in the second pulsating waveform to output voltage in a third pulsating form. The second rectifying circuit 104 may be constituted by a diode or a MOS transistor, which can achieve secondary synchronous rectification so that the third pulsating waveform is synchronized with the modulated first pulsating waveform. It is noted that the third pulsating waveform being synchronized with the modulated first pulsating waveform refers to that a phase of the third pulsating waveform and a phase of the modulated first pulsating waveform are consistent, and a change trend of an amplitude of the third pulsating waveform and a change trend of an amplitude of the modulated first pulsating waveform are consistent. The first charging interface 105 and the second rectifying circuit 104 are connected. The sampling circuit 106 is configured to sample voltage and/or current output from the second rectifying circuit 104 to obtain a voltage sampling value and/or a current sampling value. The control circuit 107 is connected to the sampling circuit 106 and the switch circuit 102. The control circuit 107 outputs the control signal to the switch circuit 102, and modulates a duty cycle of the control signal based on the voltage sampling value and/or the current sampling value so that the voltage in the third pulsating waveform output from the second rectifying circuit 104 satisfies a charging requirement.

As shown in FIG. 2B, the terminal 2 includes a second charging interface 201 and a battery 202. The second charging interface 201 is connected to the battery 202. When the second charging interface 201 and the first charging interface 105 are connected, the second charging interface 201 applies the voltage in the third pulsating waveform to the battery 202 to achieve to charging of the battery 202.

In one embodiment of the present disclosure, as shown in FIG. 1A, the power adapter 1 may adopt a flyback switching power supply. In greater detail, the transformer 103 includes a primary winding and a secondary winding. One terminal of the primary winding is connected to a first output terminal of the first rectifying circuit 101. A second output terminal of the first rectifying circuit 101 is grounded. Another terminal of the primary winding is connected to the switch circuit 102 (for example, the switch circuit 102 is the MOS transistor, so the another terminal of the primary winding is connected to a drain of the MOS transistor). The transformer 103 is configured to output the voltage in the second pulsating waveform based on the modulated voltage in the first pulsating waveform.

The transformer 103 is a high-frequency transformer, which may have an operating frequency of 50 KHz to 2 MHz. The modulated voltage in the first pulsating waveform is coupled to a secondary side by the high-frequency transformer and is output by the secondary winding. According to the embodiment of the present disclosure, using the high-frequency transformer can take advantage of the feature of smaller size of the high-frequency transformer as compared with a low-frequency transformer (a low-frequency transformer is also called a power frequency transformer, which is mainly used for the mains frequency, such as 50 Hz or 60 Hz AC)), thus achieving the miniaturization of the power adapter 1.

Figure 1B:
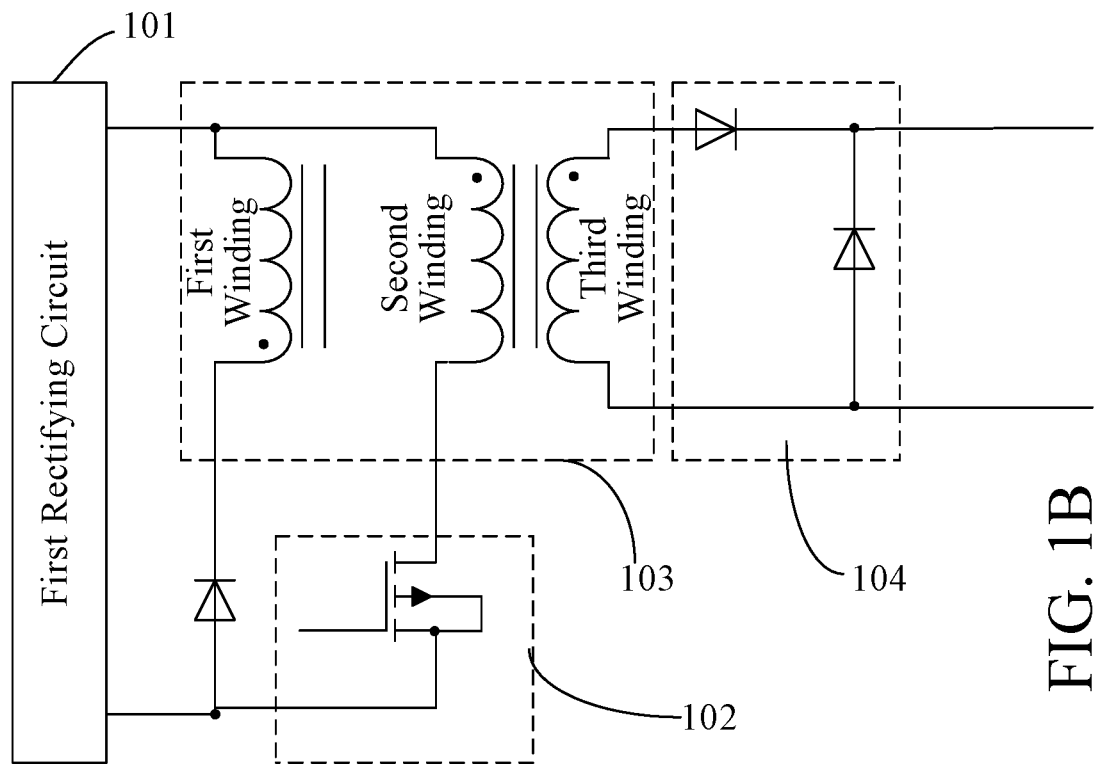
FIG. 1B illustrates a block schematic diagram of a charging system for a terminal that adopts a forward switching power supply according to one embodiment of the present disclosure.

According to one embodiment of the present disclosure, as shown in FIG. 1B, the power adapter 1 may adopt a forward switching power supply. In greater detail, the transformer 103 includes a first winding, a second winding, and a third winding. A dotted terminal of the first winding is connected to a second output terminal of the first rectifying circuit 101 through a backward diode. A non-dotted terminal of the first winding is first connected to a dotted terminal of the second winding and then they are connected to a first output terminal of the first rectifying circuit 101. A non-dotted terminal of the second winding is connected to the switch circuit 102. The third winding and the second rectifying circuit 104 are connected. The backward diode has the effect of reverse clipping. An induced electromotive force generated by the first winding can limit an amplitude of a counter electromotive force through the backward diode, and energy caused by amplitude limitation is returned to an output of the first rectifying circuit 101 to charge the output of the first rectifying circuit 101. In addition, a magnetic field generated by a current passing the first winding can demagnetize a core of the transformer so that a magnetic field strength in a transformer core is restored to an initial state. The transformer 103 is configured to output the voltage in the second pulsating waveform based on the modulated voltage in the first pulsating waveform.

Figure 1C:
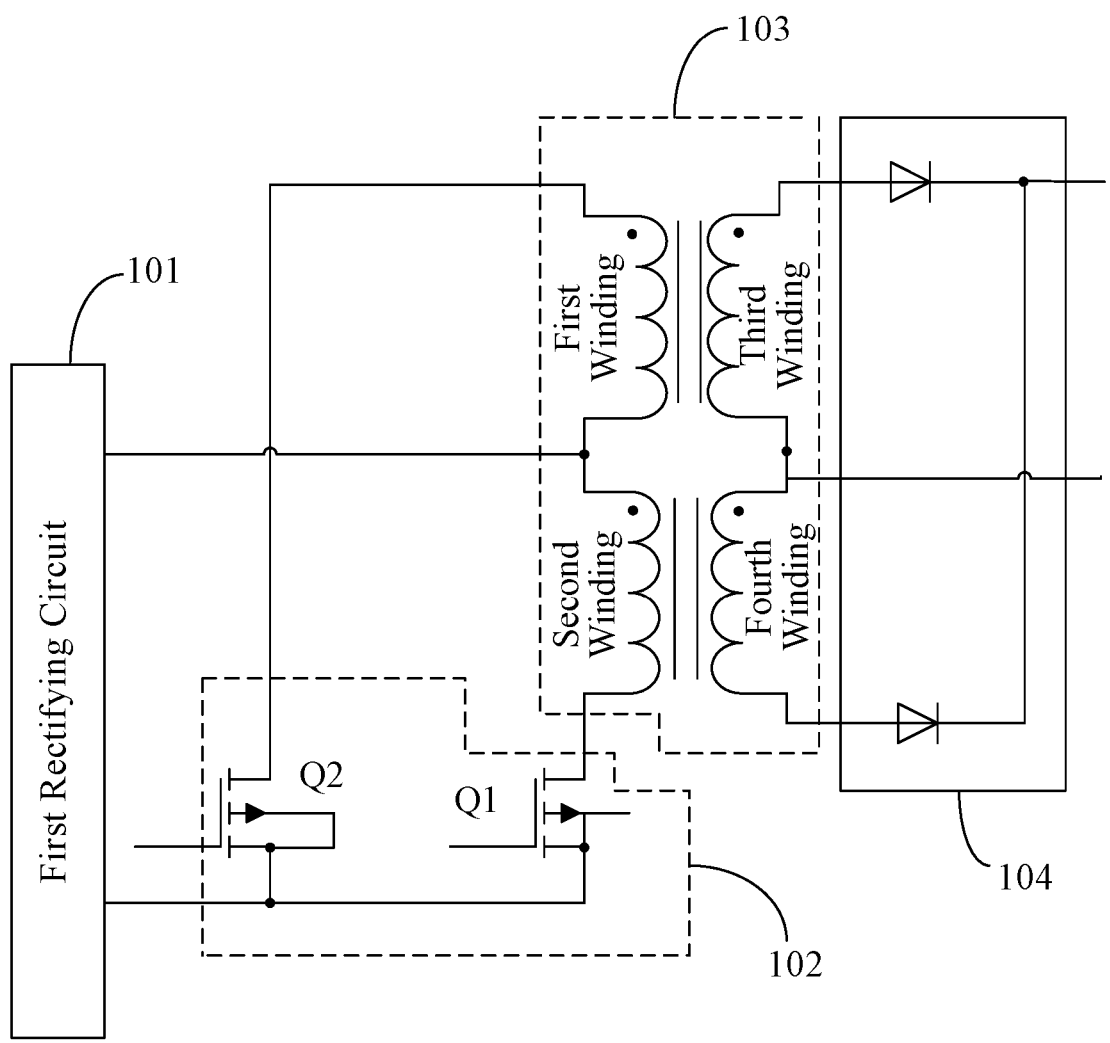
FIG. 1C illustrates a block schematic diagram of a charging system for a terminal that adopts a push pull switching power supply according to one embodiment of the present disclosure.

According to one embodiment of the present disclosure, as shown in FIG. 1C, the power adapter may adopt a push-pull switching power supply. In greater detail, the transformer 103 includes a first winding, a second winding, a third winding, and a fourth winding. A dotted terminal of the first winding is connected to the switch circuit 102. A non-dotted terminal of the first winding is first connected to a dotted terminal of the second winding and then they are connected to a first output terminal of the first rectifying circuit 101. A non-dotted terminal of the second wining is connected to the switch circuit 102. A non-dotted terminal of the third winding is connected to a dotted terminal of the fourth winding. The transformer 103 is configured to output the voltage in the second pulsating waveform based on the modulated voltage in the first pulsating waveform.

As shown in FIG. 1C, the switch circuit 102 includes a first MOS transistor Q1 and a second MOS transistor Q2. The transformer 103 includes the first winding, the second winding, the third winding, and the fourth winding. The dotted terminal of the first winding is connected to a drain of the first MOS transistor Q1 in the switch circuit 102. The non-dotted terminal of the first winding is connected to the dotted terminal of the second winding, and a node between the non-dotted terminal of the first winding and the dotted terminal of the second winding is connected to the first output terminal of the first rectifying circuit 101. The non-dotted terminal of the second wining is connected to a drain of the second MOS transistor Q2 in the switch circuit 102. A source of the first MOS transistor Q1 is first connected to a source of the second MOS transistor Q2 and then they are connected to a second output terminal of the first rectifying circuit 101. A dotted terminal of the third winding is connected to a first input terminal of the second rectifying circuit 104. The non-dotted terminal of the third winding is connected to the dotted terminal of the fourth winding, and a node between the non-dotted terminal of the third winding and the dotted terminal of the fourth winding is grounded. A non-dotted terminal of the fourth winding is connected to a second input terminal of the second rectifying circuit 104.

As shown in FIG. 1C, the first input terminal of the second rectifying circuit 104 is connected to the dotted terminal of the third winding. The second input terminal of the second rectifying circuit 104 is connected to the non-dotted terminal of the fourth winding. The second rectifying circuit 104 is configured rectify the voltage in the second pulsating waveform to output the voltage in the third pulsating waveform. The second rectifying circuit 104 may include two diodes. An anode of one diode is connected to the dotted terminal of the third winding. An anode of the other diode is connected to the non-dotted terminal of the fourth winding. Cathodes of the two diodes are connected together.

Figure 1D:
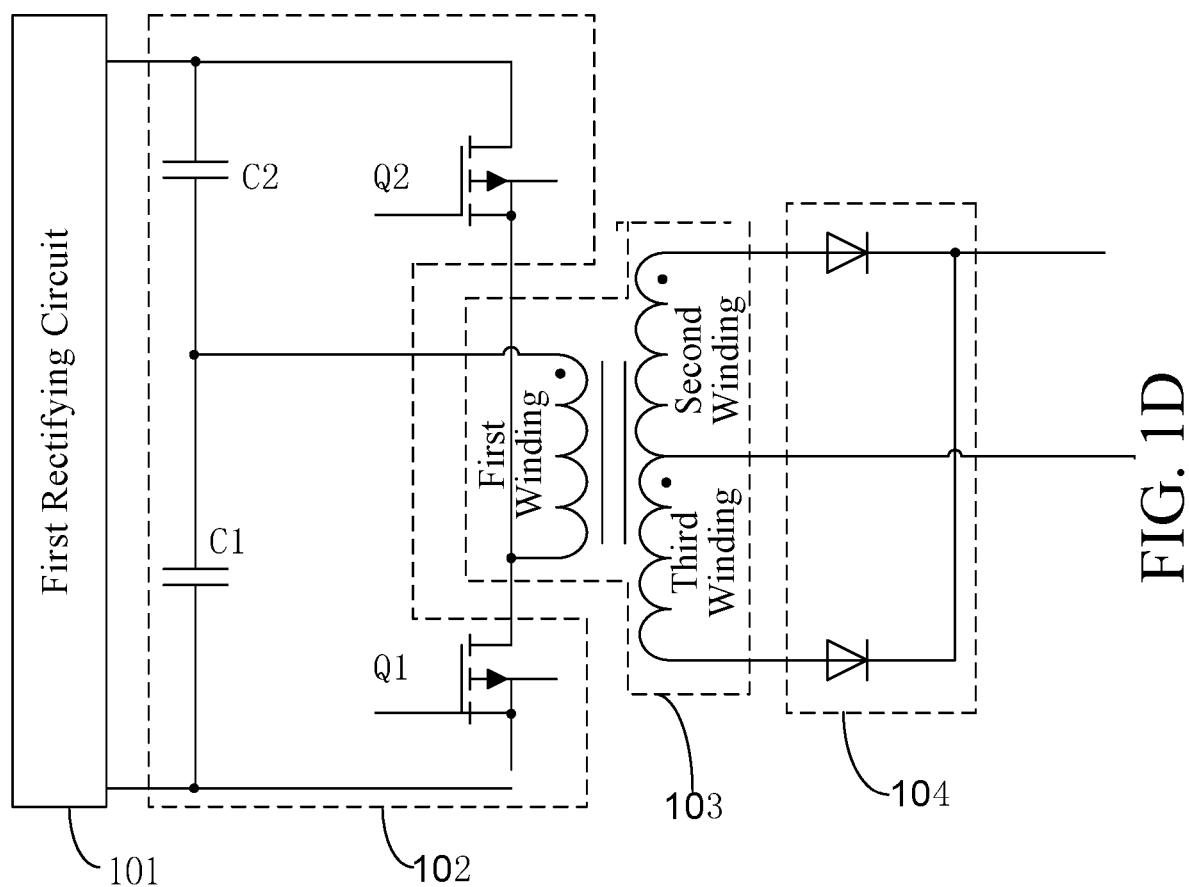
FIG. 1D illustrates a block schematic diagram of a charging system for a terminal that adopts a half-bridge switching power supply according to one embodiment of the present disclosure.

According to one embodiment of the present disclosure, as shown in FIG. 1D, the power adapter 1 may adopt a half-bridge switching power supply. In greater detail, the switch circuit 102 includes a first MOS transistor Q1, a second MOS transistor Q2, a first capacitor C1, and a second capacitor C2. The first capacitor C1 and the second capacitor C2 are first connected in series and then they are connected in parallel with output terminals of the first rectifying circuit 101. The first MOS transistor Q1 and the second MOS transistor Q2 are first connected in series and then they are connected in parallel with the output terminals of the first rectifying circuit 101. The transformer 103 includes a first winding, a second winding, and a third winding. A dotted terminal of the first winding is connected to a node between the first capacitor C1 and the second capacitor C2 connected in series. A non-dotted terminal of the first winding is connected to a node between the first MOS transistor Q1 and the second MOS transistor Q2 connected in series. A dotted end of the second winding is connected to a first input terminal of the second rectifying circuit 104. A non-dotted terminal of the second winding is first connected to a dotted terminal of the third winding and then they are grounded. A non-dotted terminal of the third winding is connected to a second input terminal of the second rectifying circuit 104. The transformer 103 is configured to output the voltage in the second pulsating waveform based on the modulated voltage in the first pulsating waveform.

Figure 1E:
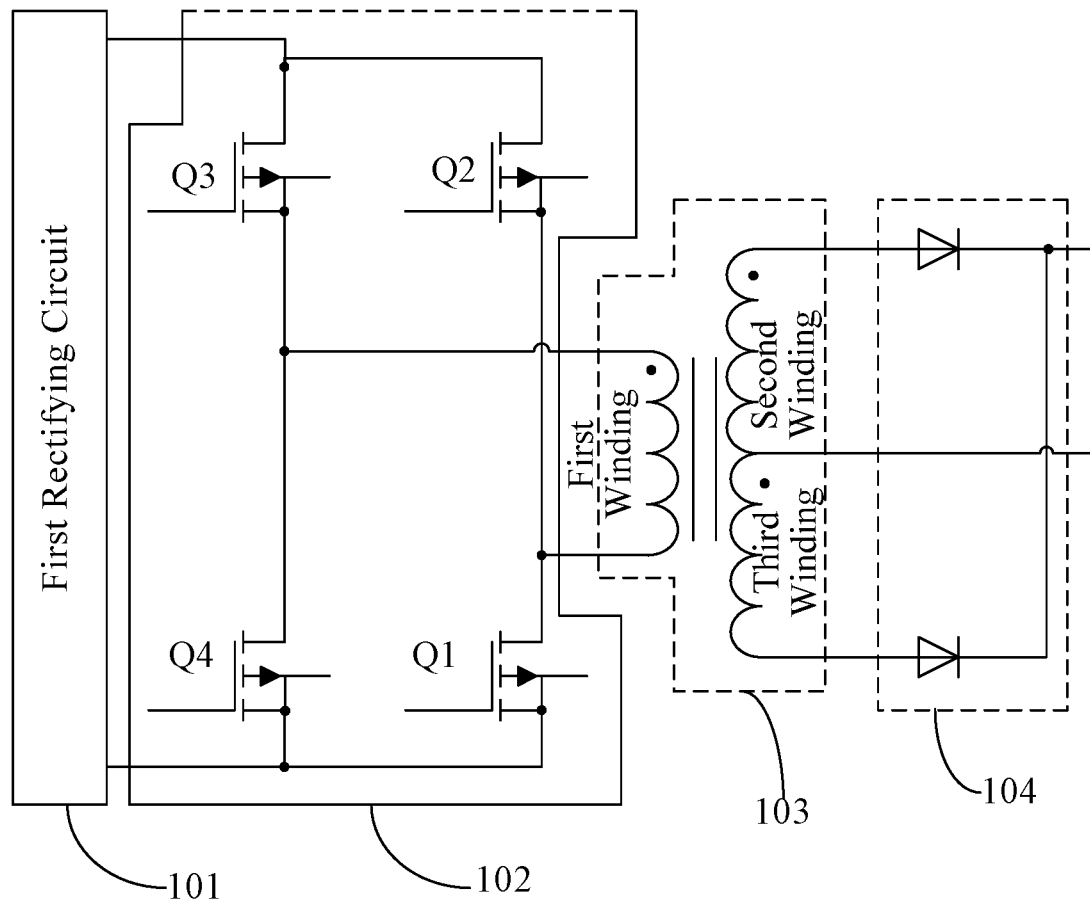
FIG. 1E illustrates a block schematic diagram of a charging system for a terminal that adopts a full-bridge switching power supply according to one embodiment of the present disclosure.

According to one embodiment of the present disclosure, as shown in FIG. 1E, the power adapter 1 may adopt a full-bridge switching power supply. In greater detail, the switch circuit 102 includes a first MOS transistor Q1, a second MOS transistor Q2, a third MOS transistor Q3, and a fourth MOS transistor Q4. The third MOS transistor Q3 and the fourth MOS transistor Q4 are first connected in series and then they are connected in parallel with output terminals of the first rectifying circuit 101. The first MOS transistor Q1 and the second MOS transistor a first connected in series and then they are connected in parallel with the output terminals of the first rectifying circuit 101. The transformer 103 includes a first winding, a second winding, and a third winding. A dotted terminal of the first winding is connected to a node between third MOS transistor Q3 and the fourth MOS transistor Q4 connected in series. A non-dotted terminal of the first winding is connected to a node between first MOS transistor Q1 and the second MOS transistor Q2 connected in series. A dotted terminal of the second winding is connected to a first input terminal of the second rectifying circuit 104. A non-dotted terminal of the second winding is first connected to a dotted terminal of the third winding and then they are grounded. A non-dotted terminal of the third winding is connected to a second input terminal of the second rectifying circuit 104. The transformer 103 is configured to output the voltage in the second pulsating waveform based on the modulated voltage in the first pulsating waveform.

Therefore, the power adapter 1 can use any of the flyback switching power supply, the forward switching power supply, the push pull switching power supply, the half-bridge switching power supply, and the full-bridge switching power supply to output the voltage in the pulsating waveform according to embodiments of the present disclosure.

In addition to that, as shown in FIG. 1A, the second rectifying circuit 104 is connected to the secondary winding of the transformer 103. The second rectifying circuit 104 is configured to rectify the voltage in the second pulsating waveform to output the voltage in a third pulsating form. The second rectifying circuit 104 may be constituted by the diode to achieve secondary synchronous rectification so that the third pulsating waveform is synchronized with the modulated first pulsating waveform. It is noted that the third pulsating waveform being synchronized with the modulated first pulsating waveform refers to that the phase of the third pulsating waveform and the phase of the modulated first pulsating waveform are consistent, and the change trend of the amplitude of the third pulsating waveform and the change trend of the amplitude of the modulated first pulsating waveform are consistent. The first charging interface 105 and the second rectifying circuit 104 are connected. The sampling circuit 106 is configured to sample the voltage and/or the current output from the second rectifying circuit 104 to obtain the voltage sampling value and/or the current sampling value. The control circuit 107 is connected to the sampling circuit 106 and the switch circuit 102. The control circuit 107 outputs the control signal to the switch circuit 102, and modulates the duty cycle of the control signal based on the voltage sampling value and/or the current sampling value so that the voltage in the third pulsating waveform output from the second rectifying circuit 104 satisfies the charging requirement.

As shown in FIG. 1A, the terminal 2 includes the second charging interface 201 and the battery 202. The second charging interface 201 is connected to the battery 202. When the second charging interface 201 and the first charging interface 105 are connected, the second charging interface 201 applies the voltage in the third pulsating waveform to the battery 202 to achieve to charging of the battery 202.

Figure 4:
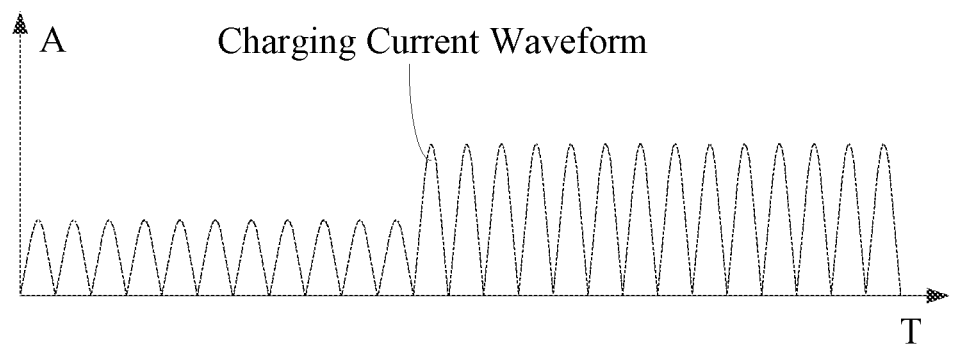
FIG. 4 illustrates a waveform of a charging current output to a battery from a power adapter according to one embodiment of the present disclosure.

The voltage in the third pulsating waveform satisfying the charging requirement refers to that the voltage and a current in the third pulsating waveform satisfy the charging voltage and the charging current when the battery is charged. That is, the control circuit 107 modulates the duty cycle of the control signal, such as a PWM signal, based on voltage and/or a current output from the power adapter thus sampled to adjust an output of the second rectifying circuit 104 in a real-time manner. A closed-loop regulation control is thus realized so that the voltage in the third pulsation waveform satisfies the charging requirement of the terminal 2 to ensure that the battery 202 is safely and reliably charged. A charging voltage waveform output to the battery 202 being regulated through the duty cycle of the PWM signal is shown in FIG. 3. A charging current waveform output to the battery 202 being regulated through the duty cycle of the PWM signal is shown in FIG. 4.

When modulating the duty cycle of the PWM signal, a regulating instruction can be generated based on the voltage sampling value, or the current sampling value, or the voltage sampling value and the current sampling value.

Hence, according to the embodiment of the present disclosure, the voltage in the first pulsation waveform, that is, the voltage in the clipped pulsating waveform, which is rectified is directly modulated by performing PWM peak clipping through controlling the switch circuit 102, and delivered to the high-frequency transformer to be coupled from the primary side to the secondary side through the high-frequency transformer, and then be recovered as the voltage/a current in the clipped pulsating waveform through synchronous rectification to be directly delivered to the battery so as to achieve the fast charging of the battery. An amplitude of the voltage in the clipped pulsating waveform can be regulated through modulating the duty cycle of the PWM signal. As a result, the output of the power adapter satisfies the charging requirement of the battery. It can be seen that the power adapter according to the embodiment of the present disclosure removes the electrolytic capacitors on the primary side and the secondary side. Through using the voltage in the clipped pulsating waveform to directly charge the battery, the size of the power adapter can be reduced to miniaturize the power adapter and significantly reduce the cost.

In one embodiment of the present disclosure, the control circuit 107 may be a micro controller unit (MCU). That is, the control circuit 107 may be a microprocessor integrated with a switch-driven control function, a synchronous rectification function, and a voltage and current regulation control function.

According to one embodiment of the present disclosure, the control circuit 107 is further configured to modulate a frequency of the control signal based on the voltage sampling value and/or the current sampling value. The PWM signal output to the switch circuit 102 can thus be controlled to be continuously output for a period of time and then be stopped. After the output has been stopped for a predetermined time, the output of the PWM is turned on again. In this manner, the voltage applied to the battery is intermittent and the battery is intermittently charged. As a result, the security worry caused by serious heating when the battery is continuously charged can be avoided to improve the reliability and safety of battery charging.

For a lithium battery, in the low temperature condition, the polarization tends to be intensified during the charging process owing the decline of the conductive abilities of the ions and electrons of the lithium battery itself. The continuous charging method will make this polarization become even more obvious, and at the same time increase the possibility of lithium precipitation, thus affecting the safe performance of the battery. In addition, the continuous charging will result in continuous accumulation of heat caused by charging, the interior temperature of the battery also continuously rises. When the temperature exceeds a certain limit value, the battery performance will be limited and at the same time the security worry is increased.

According to the embodiment of the present disclosure, through modulating the frequency of the control signal, the power adapter outputs in an intermittent manner. This situation is equivalent to that the stationary process of the battery is introduced during the battery charging process, which can alleviate the possible lithium precipitation phenomenon caused by polarization in continuous charging and reduce the effect caused by continuous accumulation of heat. The temperature is thus decreased to ensure the reliability and safety of the battery charging.

Figure 5:
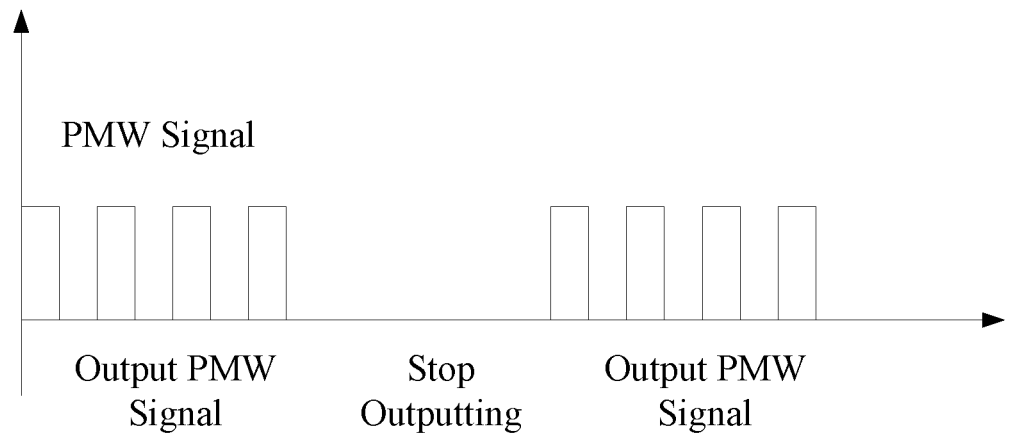
FIG. 5 illustrates a waveform of a control signal output to a switch circuit according to one embodiment of the present disclosure.

The control signal output to the switch circuit 102 may be shown in FIG. 5. The PWM signal is first continuously output for a period of time and then is stopped for a period of time, and then is continuously output for a period of time. As a result, the control signal output to the switch circuit 102 is intermittent and the frequency is adjustable.

As shown in FIG. 1A, the control circuit 107 is connected to the first charging interface 105. The control circuit 107 is further configured to communicate with the terminal 2 through the first charging interface 105 to acquire state information of the terminal 2. In this manner, the control circuit 107 is further configured to modulate the duty cycle of the control signal, such as the PWM signal, based on the state information of the terminal 2, and/or the voltage sampling value and/or the current sampling value.

The state information of the terminal 2 may include a battery level, a battery temperature, the battery voltage, interface information of the terminal, or path impedance information of the terminal, etc.

In greater detail, the first charging interface 105 includes power lines and data lines. The power lines are configured to charge the battery. The data lines are configured to communicate with the terminal 2. When the second charging interface 201 is connected to the first charging interface 105, the power adapter 1 and the terminal 2 can send a communication inquiry instruction to each other, and establish a communication connection between the power adapter 1 and the terminal 2 after receiving a reply instruction correspondingly. The control circuit 107 can acquire the state information of the terminal 2 so as to negotiate a charging mode and the charging parameters (such as the charging current, the charging voltage) with the terminal 2 and control the charging process.

The charging mode supported by the power adapter and/or the terminal may include a normal charging mode and a fast charging mode. A charge rate of the fast charging mode is greater than a charge rate of the normal charging mode (for example, a charging current of the fast charging mode is greater than a charging current of the normal charging mode). Generally speaking, the normal charging mode can be understood as the charging mode in which the rated output voltage is 5V and the rated output current is less than or equal to 2.5 A. In addition, in the normal charging mode, D+ and D− in the data lines in an output port of the power adapter may be short circuited. However, the fast charging mode according to the embodiment of the present disclosure is different. In the fast charging mode of the embodiment of the present disclosure, the power adapter can communicate with the terminal by utilizing D+ and D− in the data lines to achieve data exchange, that is, the power adapter and the terminal can send a fast charging instruction to each other. The power adapter sends a fast charging inquiry instruction to the terminal. The power adapter acquires the state information of the terminal based on a reply instruction of the terminal after receiving a fast charging reply instruction of the terminal to enable the fast charging mode. In the fast charging mode, the charging current can be greater than 2.5 A, for example, can be up to 4.5 A or even greater. However, the normal charging mode according to the embodiment of the present disclosure is not limited. As long as the power adapter supports two charging modes, and a charge rate (or current) of one of the charging modes is greater than a charge rate of the other charging mode, the charging mode having the slower charge rate can be understood as the normal charging mode.

The control circuit 107 communicates with the terminal 2 through the first charging interface 105 to determine the charging mode. The charging mode includes the fast charging mode and the normal charging mode.

In greater detail, the power adapter and the terminal are connected through a universal serial bus (USB) interface. The USB interface may be a normal USB interface, or may be a micro USB interface. Data lines in the USB interface are the data lines in the first charging interface and are configured to provide a bidirectional communication between the power adapter and the terminal. The data lines may be a D+ line and/or a D− line in the USB interface, and the bidirectional communication can refer to the information exchange between the power adapter and the terminal.

The power adapter performs the bidirectional communication with the terminal through the data lines in the USB interface to determine that the terminal is charged by the fast charging mode.

It is noted that during the process that the power adapter negotiates with the terminal to determine whether or not the terminal is charged by the fast charging mode, the power adapter may only be connected to the terminal and does not charge the terminal, or may charge the terminal by the normal charging mode, or may use a small current to charge the terminal. The embodiment of the present disclosure is not limited in this regard.

The power adapter adjusts the charging current to a charging current corresponding to the fast charging mode so as to charge the terminal. After determining to use the fast charging mode to charge the terminal, the power adapter can directly adjust the charging current to the charging current corresponding to the fast charging mode, or can negotiate with the terminal to determine the charging current of the fast charging mode. For example, the charging current corresponding to the fast charging mode is determined based on a current power level of the battery in the terminal.

According to the embodiment of the present disclosure, the power adapter does not blindly increase the output current to perform fast charging. Rather, the power adapter needs to perform the bidirectional communication with the terminal so as to negotiate whether the fast charging mode can be used or not. As compared with the prior art, the safety of fast charging process is increased.

Optionally, to serve as one embodiment, when the control circuit performs the bidirectional communication with terminal through the data lines in the first charging interface to determine that the terminal is charged by the fast charging mode, the control circuit sends a first instruction to the terminal. The first instruction is configured to inquire of the terminal whether to enable the fast charging mode or not. The control circuit receives a reply instruction responsive to the first instruction from the terminal. The reply instruction responsive to the first instruction is configured to indicate that the terminal agrees to enable the fast charging mode.

Optionally, to serve as one embodiment, before the control circuit sends the first instruction to the terminal, the power adapter charges the terminal under the normal charging mode, and the control circuit sends the first instruction to the terminal after determining that a charging time of the normal charging mode is longer than a predetermined threshold value.

After the power adapter determines that the charging time of the normal charging mode is longer than the predetermined threshold value, the power adapter can assume that the terminal has identified itself as a power adapter and can enable a fast charging inquiry communication.

Optionally, to serve as one embodiment, after the power adapter determines to use a charging current greater than or equal to a predetermined threshold current value to charge for a predetermined time, the power adapter sends the first instruction to the terminal.

Optionally, to serve as one embodiment, the control circuit is further configured to control the power adapter through controlling the switch circuit so as to adjust the charging current to the charging current corresponding to the fast charging mode. In addition, the control circuit performs the bidirectional communication with the terminal through the data lines in the first charging interface before the power adapter uses the charging current corresponding to the fast charging mode to charge the terminal so as to determine a charging voltage corresponding to the fast charging mode and control the power adapter to adjust the charging voltage to the charging voltage corresponding to the fast charging mode.

Optionally, to serve as one embodiment, when the control circuit performs the bidirectional communication with the terminal through the data lines in the first charging interface to determine the charging voltage corresponding to the fast charging mode, the control circuit sends a second instruction to the terminal. The second instruction is configured to inquire whether or not a current output voltage of the power adapter is suitable as a charging voltage of the fast charging mode. The control circuit receives a reply instruction responsive to the second instruction sent by the terminal. The reply instruction responsive to the second instruction is configured to indicate that the current output voltage of the power adapter is suitable, excessively high, or excessively low. The control circuit determines the charging voltage of the fast charging mode based on the reply instruction responsive to the second instruction.

Optionally, to serve as one embodiment, before the control circuit controls the power adapter to adjust the charging current to the charging current corresponding to the fast charging mode, the control circuit further performs the bidirectional communication with the terminal through the data lines in the first charging interface to determine the charging current corresponding to the fast charging mode.

Optionally, to serve as one embodiment, when the control circuit performs the bidirectional communication with the terminal through the data lines in the first charging interface to determine the charging current corresponding to the fast charging mode, the control circuit sends a third instruction to the terminal. The third instruction is configured to inquire about a maximum charging current currently supported by the terminal. The control circuit receives a reply instruction responsive to the third instruction sent by the terminal. The reply instruction responsive to the third instruction is configured to indicate the maximum charging current currently supported by the terminal. The control circuit determines a charging current of the fast charging mode based on the reply instruction responsive to the third instruction.

The power adapter can directly determine the maximum charging current as the charging current of the fast charge mode, or set the charging current as a current value that is less than the maximum charging current.

Optionally, to serve as one embodiment, during the process that the power adapter uses the fast charging mode to charge the terminal, the control circuit further performs the bidirectional communication with the terminal through the data lines in the first charging interface to continuously adjust the charging current output to the battery from the power adapter through controlling the switch circuit.

The power adapter can continuously inquire about current state information of the terminal, for example, inquire about the battery voltage, the battery power level, etc., so as to continuously adjust the charging current output to the battery from the power adapter.

Optionally, to serve as one embodiment, when the control circuit performs the bidirectional communication with the terminal through the data lines in the first charging interface to continuously adjust the charging current output to the battery from the power adapter through controlling the switch circuit, the control circuit sends a fourth instruction to the terminal. The fourth instruction is configured to inquire about a current voltage of the battery in the terminal. The control circuit receives a reply instruction responsive to the fourth instruction sent by the terminal. The reply instruction responsive to the fourth instruction is configured to indicate the current voltage of the battery in the terminal. The control circuit adjusts the charging current output to the battery from the power adapter through controlling the switch circuit based on the current voltage of the battery.

Optionally, to serve as one embodiment, the control circuit adjusts the charging current output to the battery from the power adapter to a charging current value corresponding to the current voltage of the battery through controlling the switch circuit based on the current voltage of the battery and a predetermined relationship between a battery voltage value and a charging current value.

The power adapter can store the relationship between the battery voltage value and the charging current value in advance. The power adapter can perform the bidirectional communication with the terminal through the data lines in the first charging interface to obtain the relationship between the battery voltage value and the charging current value stored in the terminal from a terminal side.

Optionally, to serve as one embodiment, during the process that the power adapter uses the fast charging mode to charge the terminal, the control circuit further performs the bidirectional communication with the terminal through the data lines in the first charging interface to determine whether there is a bad contact between the first charging interface and the second charging interface or not. When it is determined that there is a bad contact between the first charging interface and the second charging interface, the control circuit controls the power adapter to exit the quick charging mode.

Optionally, to serve as one embodiment, before determining whether there is a bad contact between the first charging interface and the second charging interface or not, the control circuit is further configured to receive information for indicating a path impedance of the terminal from the terminal. The control circuit sends the fourth instruction to the terminal. The fourth instruction is configured to inquire about voltage of the battery in the terminal. The control circuit receives the reply instruction responsive to the fourth instruction sent by the terminal. The reply instruction responsive to the fourth instruction is configured to indicate the voltage of the battery in the terminal. The control circuit determines a path impedance from the power adapter to the battery based on the output voltage of the power adapter and the voltage of the battery. The control circuit determines whether there is a bad contact between the first charging interface and the second charging interface or not based on the path impedance from the power adapter to the battery, the path impedance of the terminal, and a path impedance of the charging lines between the power adapter and the terminal.

The terminal can record the path impedance of the terminal in advance. For example, since terminals of a same model have a same structure, path impedances of the terminals are set as a same value in default setting. Similarly, the power adapter can record the path impedance of the charging lines in advance. When the power adapter obtains voltage across two terminals of the battery of the terminal, a path impedance of an overall path can be determined based on a voltage drop between the power adapter and the two terminals of the battery and a path current. Upon on a condition that the path impedance of the overall path is greater than a sum of the path impedance of the terminal and the path impedance of the charging lines, or the path impedance of the overall path minus a sum of the path impedance of the terminal and the path impedance of the charging lines is greater than a threshold impedance value, it is determined that there is a bad contact between the first charging interface and the second charging interface.

Optionally, to serve as one embodiment, before the power adapter exits the quick charging mode, the control circuit further sends a fifth instruction to the terminal. The fifth instruction is configured to indicate that there is a bad contact between the first charging interface and the second charging interface.

After the power adapter sends the fifth instruction, the power adapter can exit the fast charging mode or reset.

In the above, the fast charging process according to the embodiment of the present disclosure is described in detail from the viewpoint of the power adapter, and the fast charging process according to the embodiment of the present disclosure is provided from the viewpoint of the terminal as follows.

Since the interactions between and relevant characteristics, functions, etc. of the power adapter and the terminal described from the terminal side are corresponding to the description from the power adapter side, a repeated description is not provided where appropriate to simplify matters.

Figure 13:
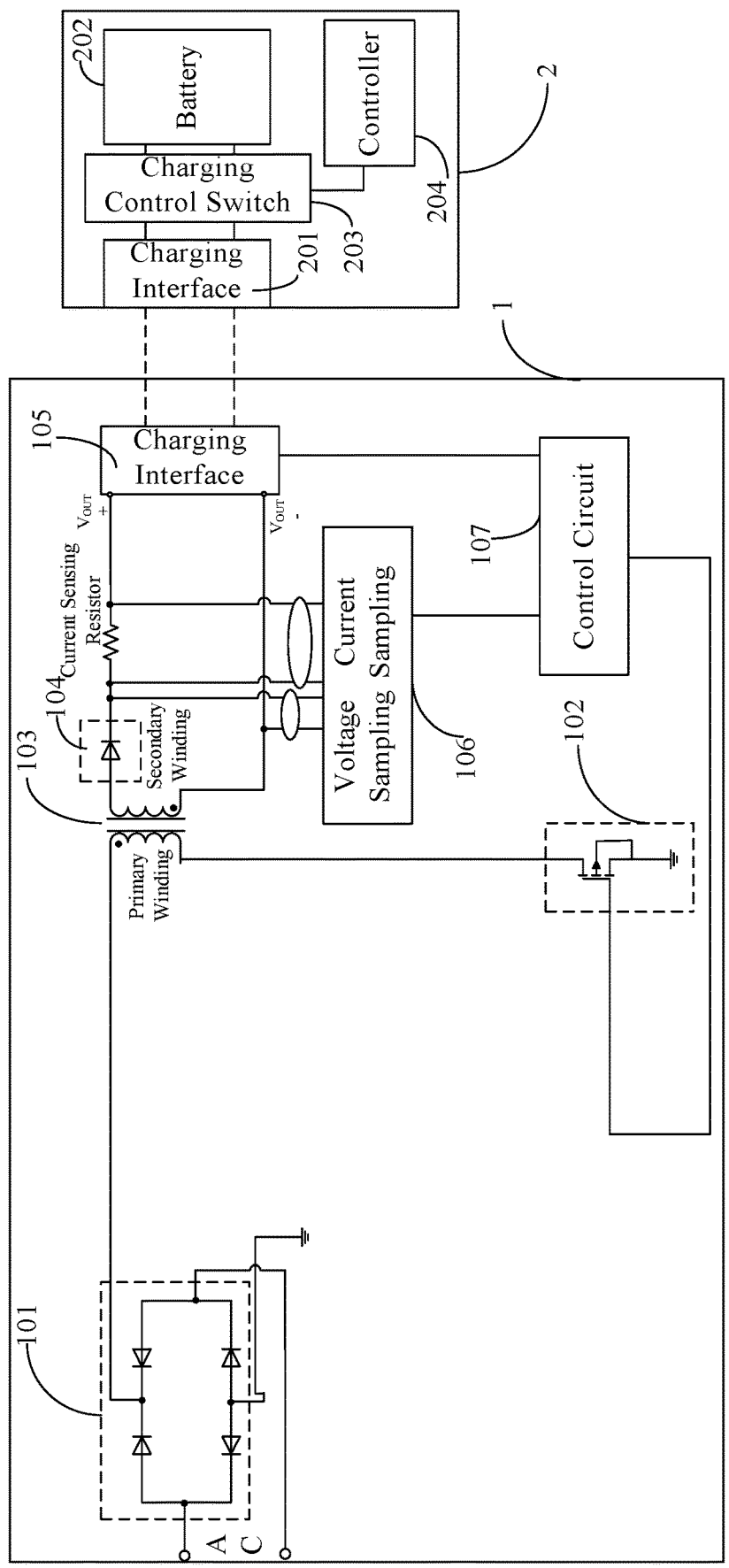
FIG. 13 illustrates a block schematic diagram of a terminal according to one embodiment of the present disclosure.

According to one embodiment of the present disclosure, as shown in FIG. 13, the terminal 2 further includes a charging control switch 203 and a controller 204. The charging control switch 203, such as a switch circuit constituted by electronic switch elements, is connected between the second charging interface 201 and the battery 202. The charging control switch 203 is configured to enable or end a charging process of the battery 202 under a control of the controller 204, so that the charging process of the battery 202 can be controlled from the terminal side to ensure the safety and reliability of the charging of the battery 202.

Figure 14:
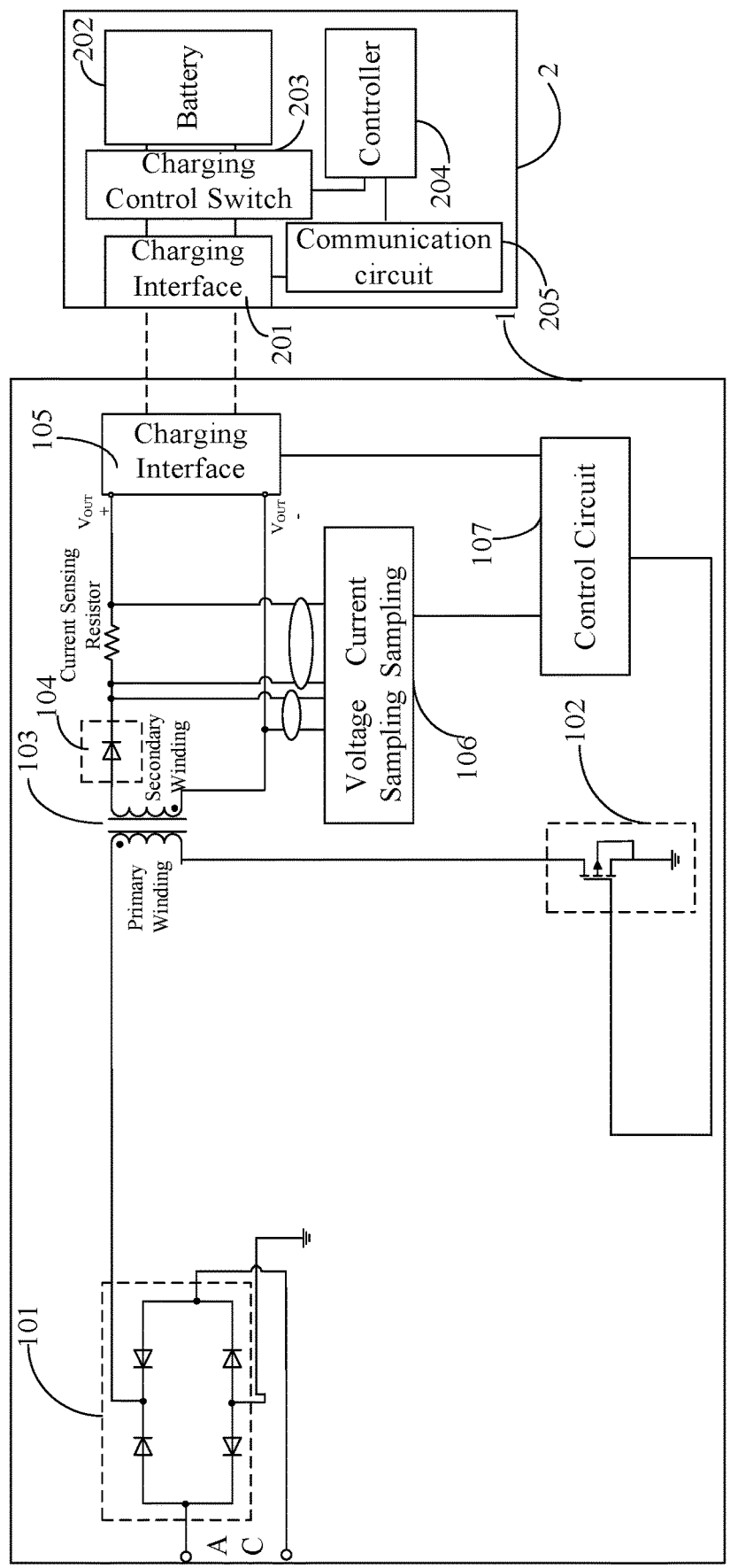
FIG. 14 illustrates a block schematic diagram of a terminal according to another embodiment of the present disclosure.

As shown in FIG. 14, the terminal 2 further includes a communication circuit 205. The communication circuit 205 is configured to establish a bidirectional communication between the controller 204 and the control circuit 107 through the second charging interface 201 and the first charging interface 105. That is, the terminal 2 and the power adapter 1 can perform the bidirectional communication through the data lines in the USB interface. The terminal 2 supports the normal charging mode and the fast charging mode. A charging current of the fast charging mode is greater than a charging current of the normal charging mode. The communication circuit 205 and the control circuit 107 perform a bidirectional communication to allow the power adapter 1 to determine using the fast charging mode to charge the terminal 2, so that the control circuit 107 controls the power adapter 1 to output the charging current corresponding to the fast charging mode to charge the battery 202 in the terminal 2.

According to the embodiment of the present disclosure, the power adapter 1 does not blindly increase the output current to perform fast charging. Rather, the power adapter 1 needs to perform the bidirectional communication with the terminal 2 so as to negotiate whether the fast charging mode can be used or not. As compared with the prior art, the safety of fast charging process is improved.

Optionally, to serve as one embodiment, the controller receives a first instruction sent by the control circuit through the communication circuit. The first instruction is configured to inquire of the terminal whether to enable the fast charging mode or not. The controller sends a reply instruction responsive to the first instruction to the control circuit through the communication circuit. The reply instruction responsive to the first instruction is configured to indicate that the terminal agrees to enable the fast charging mode.

Optionally, to serve as one embodiment, before the controller receives the first instruction sent by the control circuit though the communication circuit, the power adapter charges the battery in the terminal through the normal charging mode. After the control circuit determines that a charging time of the normal charging mode is longer than a predetermined threshold value, the control circuit sends the first instruction to the communication circuit in the terminal. The controller receives the first instruction sent by the control circuit through the communication circuit.

Optionally, to serve as one embodiment, before the power adapter outputs the charging current corresponding to the fast charging mode to charge the battery in the terminal, the controller performs the bidirectional communication with the control circuit through the communication circuit to allow the power adapter to determine the charging voltage corresponding to the fast charging mode.

Optionally, to serve as one embodiment, the controller receives a second instruction sent by the control circuit. The second instruction is configured to inquire whether or not a current output voltage of the power adapter is suitable as the charging voltage of the fast charging mode. The controller sends a reply instruction responsive to the second instruction to the control circuit. The reply instruction responsive to the second instruction is configured to indicate that the current output voltage of the power adapter is suitable, excessively high, or excessively low.

Optionally, to serve as one embodiment, the controller performs the bidirectional communication with the control circuit to allow the power adapter to determine the charging current corresponding to the fast charging mode.

The controller receives a third instruction sent by the control circuit. The third instruction is configured to inquire about a maximum charging current currently supported by the terminal. The controller sends a reply instruction responsive to the third instruction to the control circuit. The reply instruction responsive to the third instruction is configured to indicate the maximum charging current currently supported by the battery in the terminal to allow the power adapter to determine the charging current corresponding to the fast charging mode based on the maximum charging current.

Optionally, to serve as one embodiment, during the process that the power adapter uses the fast charging mode to charge the terminal, the controller performs the bidirectional communication with the control circuit to allow the power adapter to continuously adjust the charging current output to the battery from the power adapter.

The controller receives a fourth instruction sent by the control circuit. The fourth instruction is configured to inquire about a current voltage of the battery the terminal. The controller sends a reply instruction responsive to the fourth instruction to the control circuit. The reply instruction responsive to the fourth instruction is configured to indicate the current voltage of the battery in the terminal to allow the power adapter to continuously adjust the charging current output to the battery from the power adapter based on the current voltage of the battery.

Optionally, to serve as one embodiment, during the process that the power adapter uses the fast charging mode to charge the terminal, the controller performs the bidirectional communication with the control circuit through the communication circuit to allow the power adapter to determine whether there is a bad contact between the first charging interface and the second charging interface or not.

The controller receives the fourth instruction sent by the control circuit. The fourth instruction is configured to inquire about the current voltage of the battery in the terminal. The controller sends the reply instruction responsive to the fourth instruction to the control circuit. The reply instruction responsive to the fourth instruction is configured to indicate the current voltage of the battery in the terminal to allow the control circuit to determine whether there is a bad contact between the first charging interface and the second charging interface or not based on the output voltage of the power adapter and the current voltage of the battery.

Optionally, to serve as one embodiment, the controller receives a fifth instruction sent by the control circuit. The fifth instruction is configured to indicate that there is a bad contact between the first charging interface and the second charging interface.

Figure 6:
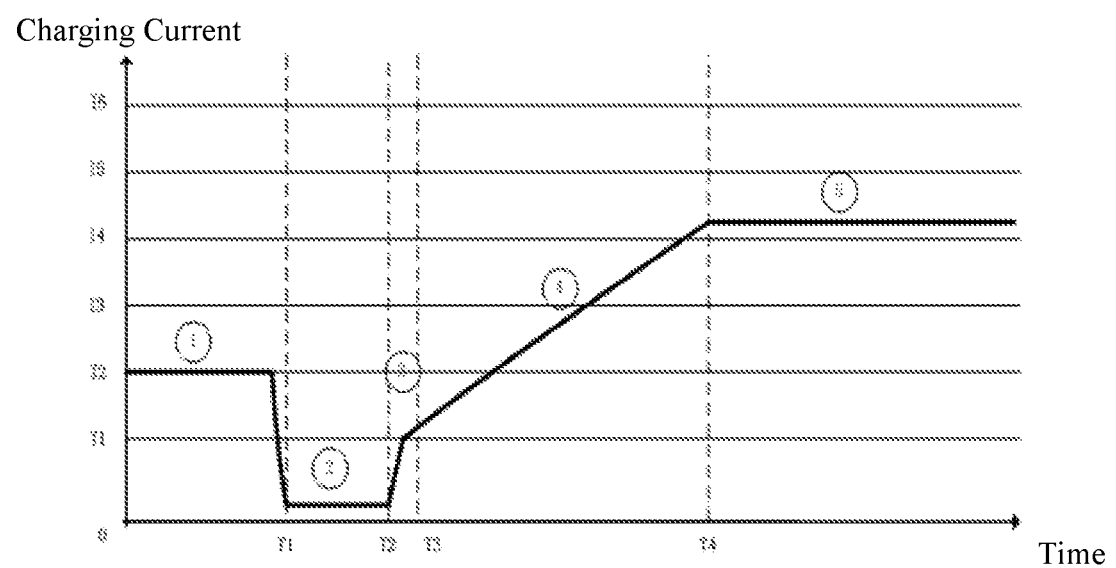
FIG. 6 illustrates a schematic diagram of a fast charging process according to one embodiment of the present disclosure.

In order to enable and use the fast charging mode, the power adapter can perform a fast charging communication process with the terminal. Through one or more handshake negotiations, the fast charging of the battery is achieved. A detailed description of the fast charging communication process and various stages of the fast charging process according to the embodiment of the present disclosure is provided as follows with reference to FIG. 6. It should be understood that the communication steps or operations shown in FIG. 6 are merely examples, and the embodiment of the present disclosure may further perform other operations or variations of the various operations in FIG. 6. In addition, the various stages in FIG. 6 may be performed in an order different from that presented in FIG. 6, and it may not be necessary to perform all the operations in FIG. 6. It is noted that the curve in FIG. 6 is a change trend of a peak value or an average value of a charging current, rather than an actual charging current curve.

As shown in FIG. 6, the fast charging process may include five stages.

Stage 1:

After a terminal is connected to a power supply device, the terminal can detect a type of the power supply device through data lines D+, D−. When the power supply device is detected as a power adapter, a current absorbed by the terminal may be greater than a predetermined threshold current value (for example, may be 1 A). When the power adapter detects that an output current of the power adapter has been greater than or equal to I2 for a predetermined time (for example, may be a continuous T1 duration), the power adapter regards that the terminal has completed the type identification of the power supply device. The power adapter turns on a handshake communication between the power adapter and the terminal. The power adapter sends an instruction 1 (corresponding to the first instruction as described above) to inquire of the terminal whether to enable the fast charging mode or not (or called flash charging).

When the power adapter receives a reply instruction of the terminal indicating that the terminal does not agree to enable the fast charging mode, the output current of the power adapter is detected again. When the output current of the power adapter is still greater than or equal to I2 within a predetermined continuous time (for example, may be the continuous T1 duration), a request is sent again to inquire of the terminal whether to enable the fast charging mode or not. The above steps of stage 1 are repeated until the terminal responds to agree to enable the fast charging mode, or the output current of the power adapter no longer satisfies the condition of being greater than or equal to I2.

The fast charging process is turned on after the terminal agrees to enable the fast charging mode. The fast charging communication process enters a stage 2.

Stage 2:

Voltage in a clipped pulsating waveform output from the power adapter may include plural levels. The power adapter sends an instruction 2 (corresponding to the second instruction as described above) to the terminal to inquire of the terminal whether or not an output voltage of the power adapter matches a current voltage of the battery (or whether or not suitable, that is, whether or not suitable as a charging voltage of the fast charging mode), that is, whether or not satisfy the charging requirement.

The terminal responds that the output voltage of the power adapter is excessively high or excessively low or matching. If the power adapter receives a feedback of the terminal that the output voltage of the power adapter is excessively high or excessively low, the control circuit adjusts the output voltage of the power adapter by one level through adjusting a duty cycle of a PWM signal, and sends the instruction 2 to the terminal again to re-inquire whether the output voltage of the power adapter matches or not.

The above steps of stage 2 are repeated until the terminal responds to the power adapter that the output voltage of the power adapter is at a matching level, and the fast charging process enters a stage 3.

Stage 3:

After the power adapter receives the feedback replied by the terminal that the output voltage of the power adapter is matching, the power adapter sends an instruction 3 (corresponding to the third instruction as described above) to the terminal to inquire of the terminal a maximum charging current currently supported by the terminal. The terminal responds to the power adapter with the maximum charging current currently supported by the terminal, and the fast charging process enters a stage 4.

Stage 4:

After the power adapter receives a feedback of the maximum charging current currently supported replied by the terminal, the power adapter can dispose an output current reference value of the power adapter. The control circuit 107 adjusts the duty cycle of the PWM signal based the output current reference value so that the output current of the power adapter satisfies the requirement of the charging current of the terminal, that is, enters the constant current stage. Here the constant current stage refers to that a peak value or an average value of the output current of the power adapter basically remains unchanged (that is, a change amplitude of the peak value or the average value of the output current is very small, for example, changes within 5% of the peak value or the average value of the output current). In other words, a peak value of a current in a third pulsating waveform remains constant in every period.

Stage 5:

When entering the constant current stage, the power adapter sends an instruction 4 (corresponding to the fourth instruction as described above) at every interval of time to inquire of the terminal a current voltage. The terminal can feed back the current voltage of the battery of the terminal to the power adapter. The power adapter can determine whether a USB contact, that is, a contact between a first charging interface and a second charging interface is good or not and whether it is necessary to reduce a current charging current value of the terminal or not based on a feedback of the current voltage of the battery of the terminal replied by the terminal. When the power adapter determines that the USB contact is bad, the power adapter sends an instruction 5 (corresponding to the fifth instruction as described above) and then resets to enter stage 1.

Optionally, in some embodiments, when the terminal responds to the instruction 1 in stage 1, data corresponding to the instruction 1 can attach data (or information) of a path impedance of the terminal. Path impedance data of the terminal may be used for determining whether the USB contact is good or not in stage 5.

Optionally, in some embodiments, time from where the terminal agrees to enable the fast charging mode to where the power adapter adjusts the voltage to an appropriate value in stage 2 can be controlled within a certain range. If the time exceeds a predetermined range, the terminal can determine that a request is abnormal and resets quickly.

Optionally, in some embodiments, the terminal can give a feedback that the output voltage of the power adapter is suitable/matching to the power adapter when the output voltage of the power adapter is adjusted to $\Delta V$ ($\Delta V$ is about 200 to 500 mV) higher than the current voltage of the battery in stage 2. When the terminal gives a feedback that the output voltage of the power adapter is not suitable (that is, excessively high or excessively low) to the power adapter, the control circuit 107 adjusts the duty cycle of the PWM signal based on a voltage sampling value to adjust the output voltage of the power adapter.

Optionally, in some embodiments, a speed of adjusting a magnitude of the output current of the power adapter can be controlled within a certain range in stage 4, so as to avoid an abnormal interruption caused by excessively fast adjustment speed.

Optionally, in some embodiments, a change amplitude of the magnitude of the output current of the power adapter can be controlled within 5% in stage 5. That is, the constant current stage is identified.

Optionally, in some embodiments, the power adapter monitors a charging circuit impedance in a real-time manner in stage 5. That is, an overall charging circuit impedance is monitored through measuring the output voltage of the power adapter and the current charging current, and reading a battery voltage of the terminal. When it is detected that the charging circuit impedance is greater than a path impedance of the terminal plus an impedance of fast charging data lines, the USB contact is regarded as bad to perform a fast charging reset.

Optionally, in some embodiments, after the fast charging mode is turned on, a communication time interval between the power adapter and the terminal can be controlled within a certain range to avoid the fast charging reset.

Optionally, in some embodiments, a stop of the fast charging mode (or the fast charging process) can be classified into a recoverable stop and an unrecoverable stop.

For example, when the terminal detects that the battery is full or the USB contact is bad, the fast charging is stopped and a reset is performed to enter stage 1. The terminal does not agree to enable the fast charging mode. The fast charging communication process does not enter stage 2. At this time, the fast charging process that has been stopped can be an unrecoverable stop.

In addition, for example, when there is an abnormal communication between the terminal and the power adapter, the fast charging is stopped and the reset is performed to enter stage 1. After the requirement of stage 1 is met, the terminal agrees to enable the fast charging mode to restore the fast charging process. At this time, the fast charging process that has been stopped can be a recoverable stop.

Additionally, for example, when the terminal detects that the battery is abnormal, the fast charging is stopped and the reset is performed to enter stage 1. After entering stage 1, the terminal does not agree to enable the fast charging mode. After the battery returns to normal and satisfies the requirement of stage 1, the terminal agrees to enable the fast charging mode to restore the fast charging process. At this time, the fast charging process that has been stopped can be a recoverable stop.

The communication steps or operations shown in FIG. 6 are merely examples. For example, in stage 1, a handshake communication between the terminal and the power adapter may be initiated by the terminal after the terminal is connected to the power adapter. That is, the terminal sends the instruction 1 to inquire of the power adapter whether to enable the fast charging mode (or called flash charging) or not. When the terminal receives a replay instruction of the power adapter indicating that the power adapter agrees to enable the fast charging mode, the fast charging process is enabled.

The communication steps or operations shown in FIG. 6 are merely examples. For example, a constant voltage charging stage may be further included after stage 5. That is, in stage 5, the terminal can feed back the current voltage of the battery of the terminal to the power adapter. As voltage of the battery of the terminal rises continuously, the charging is changed to the constant voltage charging stage when the current voltage of the battery of the terminal reaches a threshold constant voltage charging voltage value. The control circuit 107 adjusts the duty cycle of the PWM signal based on a voltage reference value (that is, the threshold constant voltage charging voltage value) so that the output voltage of the power adapter satisfies the requirement of the charging voltage of the terminal, that is, the voltage is basically maintained constantly without change. In the constant voltage charging stage, the charging current gradually decreases. When the current drops to a certain threshold value, the charging is stopped. At this time, the battery is identified as being fully charged. Here the constant voltage charging refers to that a peak voltage of the third pulsating waveform is basically maintained constantly.

According to the embodiment of the present disclosure, obtaining the output voltage of the power adapter refers to obtaining the peak voltage or an average voltage value of the third pulsating waveform. Obtaining the output current of the power adapter refers to obtaining a peak current or an average current value of the third pulsating waveform.

Figure 7A:
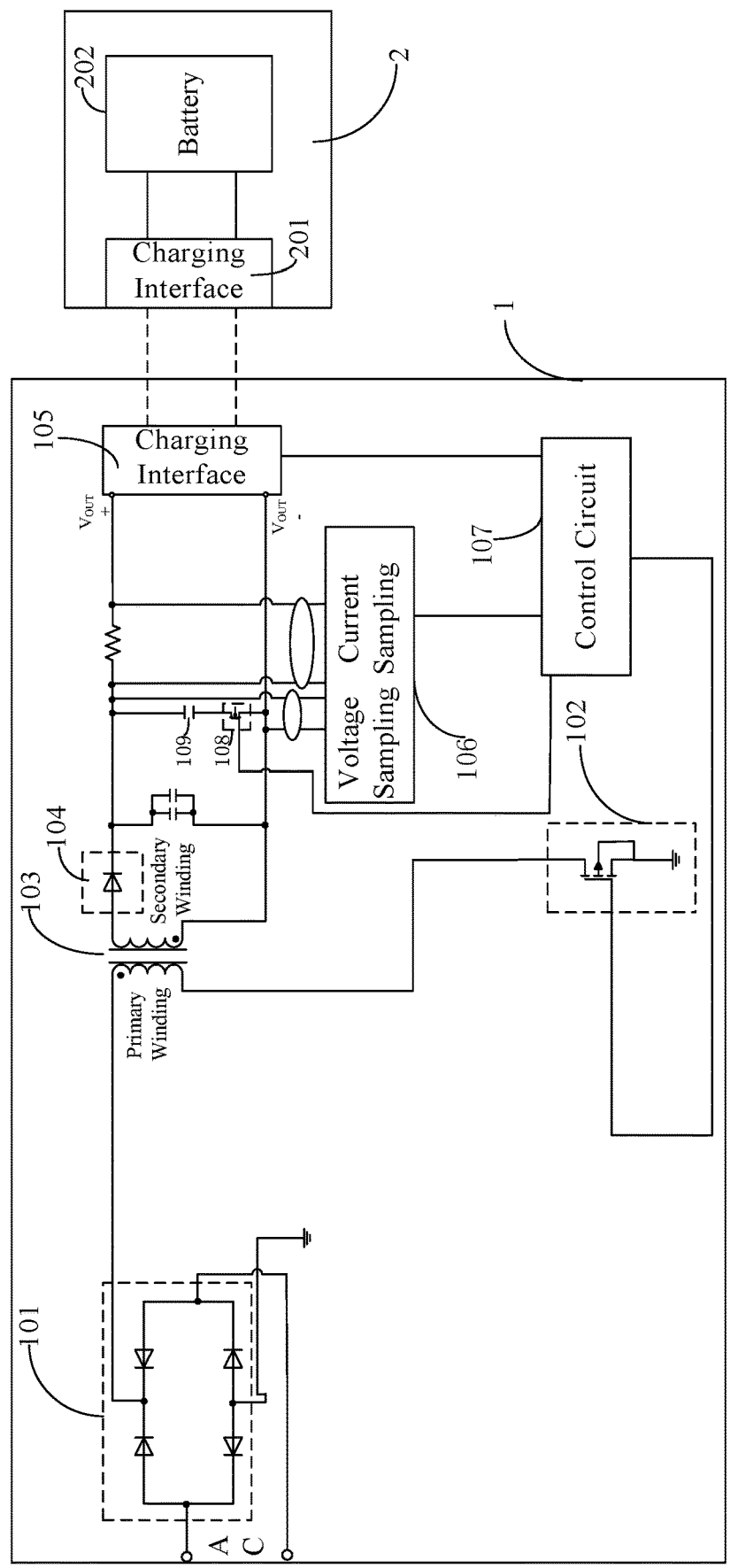
FIG. 7A illustrates a block schematic diagram of a charging system for a terminal according to one embodiment of the present disclosure.
Figure 7B:
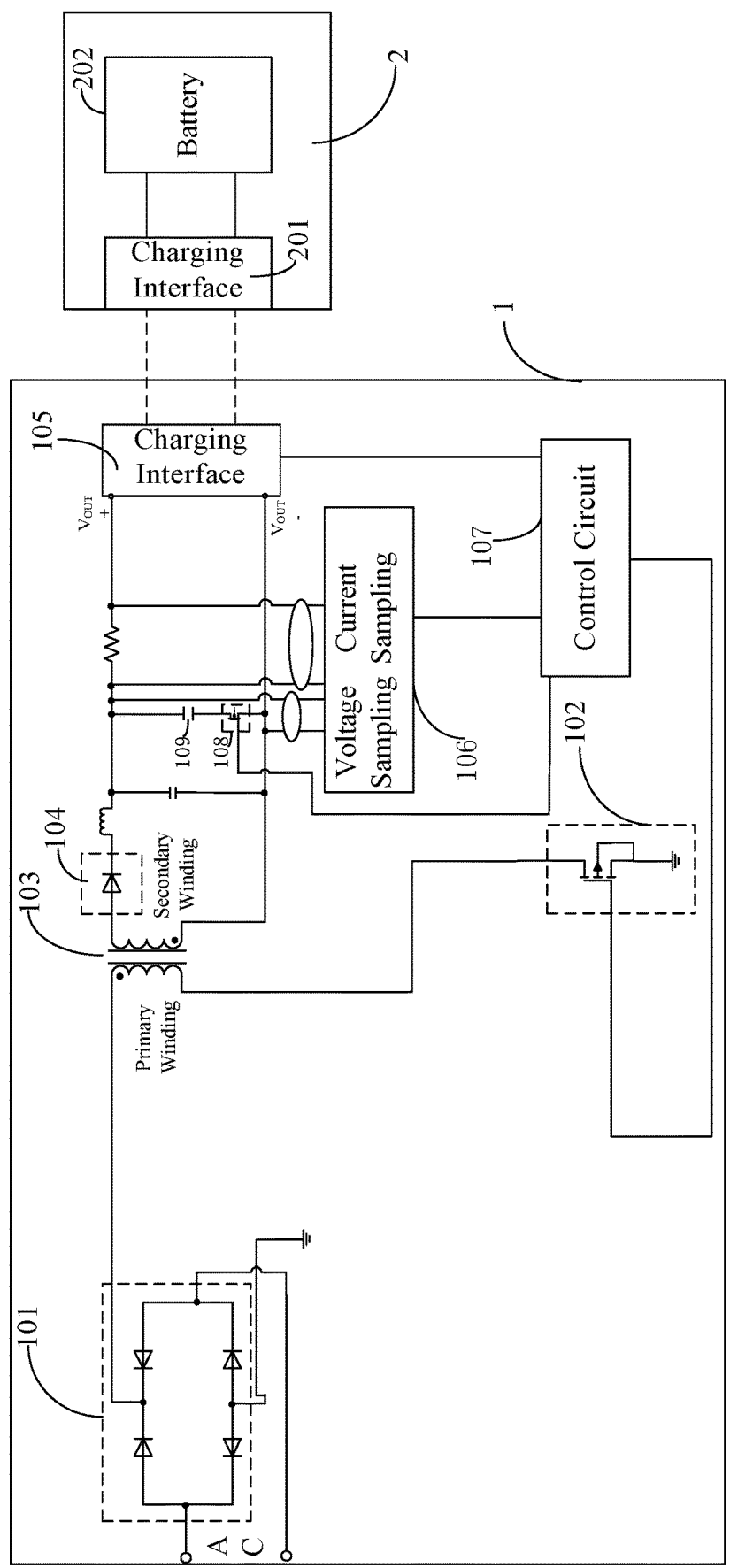
FIG. 7B illustrates a block schematic diagram of a power adapter having an LC filter circuit according to one embodiment of the present disclosure.

According to one embodiment of the present disclosure, as shown in FIG. 7A, the power adapter 1 further includes: a controllable switch 108 and a filter circuit 109 connected in series. The serially connected controllable switch 108 and filter circuit 109 are connected to a first output terminal of the second rectifying circuit 104. The control circuit 107 is further configured to control the controllable switch 108 to close when a charging mode is determined to be the normal charging mode, and control the controllable switch 108 to open when the charging mode is determined to be a fast charging mode. In addition, one or more small capacitors are further connected in parallel at an output terminal of the second rectifying circuit 104. Not only can the noise be reduced, but the occurrence of surge phenomenon is also reduced. Or, the output terminal of the second rectifying circuit 104 may further be connected to an LC filter circuit or a π filter circuit to filter the ripple interference. As shown in FIG. 7B, the output terminal of the second rectifying circuit 104 is connected to the LC filter circuit. It is noted that capacitors in the LC filter circuit or the π filter circuit are all small capacitors, which take a very small area.

The filter circuit 109 includes a filter capacitor. The filter capacitor can support 5V standard charging, that is, correspond to the normal charging mode. The controllable switch 108 may be constituted by a semiconductor switch device, such as a MOS transistor. When the power adapter uses the normal charging mode (or called standard charging) to charge the battery in the terminal, the control circuit 107 controls the controllable switch 108 to close. The filter circuit 109 is connected to the circuit so that an output of the second rectifying circuit can be filtered. In this manner, the power adapter can be better compatible with the DC charging technology. That is, a DC power is applied to the battery of the terminal to achieve DC charging of the battery. For example, under normal circumstances, a filter circuit including an electrolytic capacitor and an ordinary capacitor connected in parallel would support a small capacitor required by 5V standard charging (such as a solid state capacitor). Since the electrolytic capacitor occupies a larger volume, the electrolytic capacitor in the power adapter can be removed to retain a capacitor having a smaller capacitance so as to reduce the size of the power adapter. When the normal charging mode is used, a branch where the small capacitor is located can be controlled to conduct. The current is thus filtered to achieve a stable low-power output so that the DC charging of the battery is performed. When the fast charging mode is used, the branch where the small capacitor is located can be controlled to disconnect. The output of the second rectifying circuit 104 is not filtered. Voltage/current in a pulsating waveform is directly output to be applied to the battery, thus achieving fast charging of the battery.

According to one embodiment of the present disclosure, the control circuit 107 is further configured to obtain a charging current and/or a charging voltage corresponding to the fast charging mode based on state information of the terminal when the charging mode is determined to be the fast charging mode, and modulate a duty cycle of a PWM signal based on the charging current and/or the charging voltage corresponding to the fast charging mode. That is, when a current charging mode is determined to be the fast charging mode, the control circuit 107 obtains the charging current and/or the charging voltage corresponding to the fast charging mode based on acquired state information of the terminal, such as a battery voltage, a battery level, a battery temperature, operating parameters of the terminal, and power consumption information of an application running on the terminal, etc., then modulates the duty cycle of a control signal based on the obtained charging current and/or charging voltage. As a result, an output of the power adapter satisfies the charging requirement to achieve the fast charging of the battery.

The state information of the terminal includes the battery temperature. Additionally, when the battery temperature is higher than a first predetermined threshold temperature or lower than a second predetermined threshold temperature, the fast charging mode is switched to the normal charging mode if the current charging mode is the fast charging mode. The first predetermined threshold temperature is higher the second predetermined threshold temperature. In other words, when the battery temperature is excessively low (for example, the battery temperature lower than the second predetermined threshold temperature) or excessively high (for example, the battery temperature higher than the first predetermined threshold temperature), neither is suitable for fast charging. Therefore, the fast charging mode needs to be switched to the normal charging mode. According to one embodiment of the present disclosure, the first predetermined threshold temperature and the second predetermined threshold temperature may be set or written to a memory of the control circuit (such as an MCU of the power adapter) depending on practical situations.

In one embodiment of the present disclosure, the control circuit 107 is further configured to control the switch circuit 102 to turn off when the battery temperature is higher than a high temperature protection threshold that is predetermined. That is, the control circuit 107 needs to adopt a high temperature protection strategy to control the switch circuit 102 to turn off when the battery temperature exceeds the high temperature protection threshold, so that the power adapter stops charging the battery. The high temperature protection of battery is thus achieved to improve charging safety. The high temperature protection threshold may be different from the first predetermined threshold temperature, or may be the same as the first predetermined threshold temperature. In at least one embodiment, the high temperature protection threshold is higher than the first predetermined threshold temperature.

In another embodiment of the present disclosure, a controller is further configured to acquired the battery temperature, and control a charging control switch to turn off when the battery temperature is higher than the high temperature protection threshold that is predetermined. That is, the charging control switch is turned off through a terminal side to turn off the charging process of the battery so as to ensure charging safety.

In one embodiment of the present disclosure, the control circuit is further configured to acquire a temperature of the first charging interface, and control the switch circuit to turn off when the temperature of the first charging interface is higher than a predetermined protection temperature. That is, the control circuit 107 also needs to execute the high temperature protection strategy to control the switch circuit 102 to turn off when the temperature of the first charging interface exceeds a certain temperature, so that the power adapter stops charging the battery. The high temperature protection of charging interface is thus achieved to improve the charging safety.

In another embodiment of the present disclosure, the controller acquires the temperature of the first charging interface through performing a bidirectional communication with the control circuit, and controls the charging control switch (see FIG. 13 and FIG. 14) to turn off when the temperature of the first charging interface is higher than the predetermined protection temperature. That is, the charging control switch is turned off through the terminal side to turn off the charging process of the battery so as to ensure charging safety.

Figure 8:
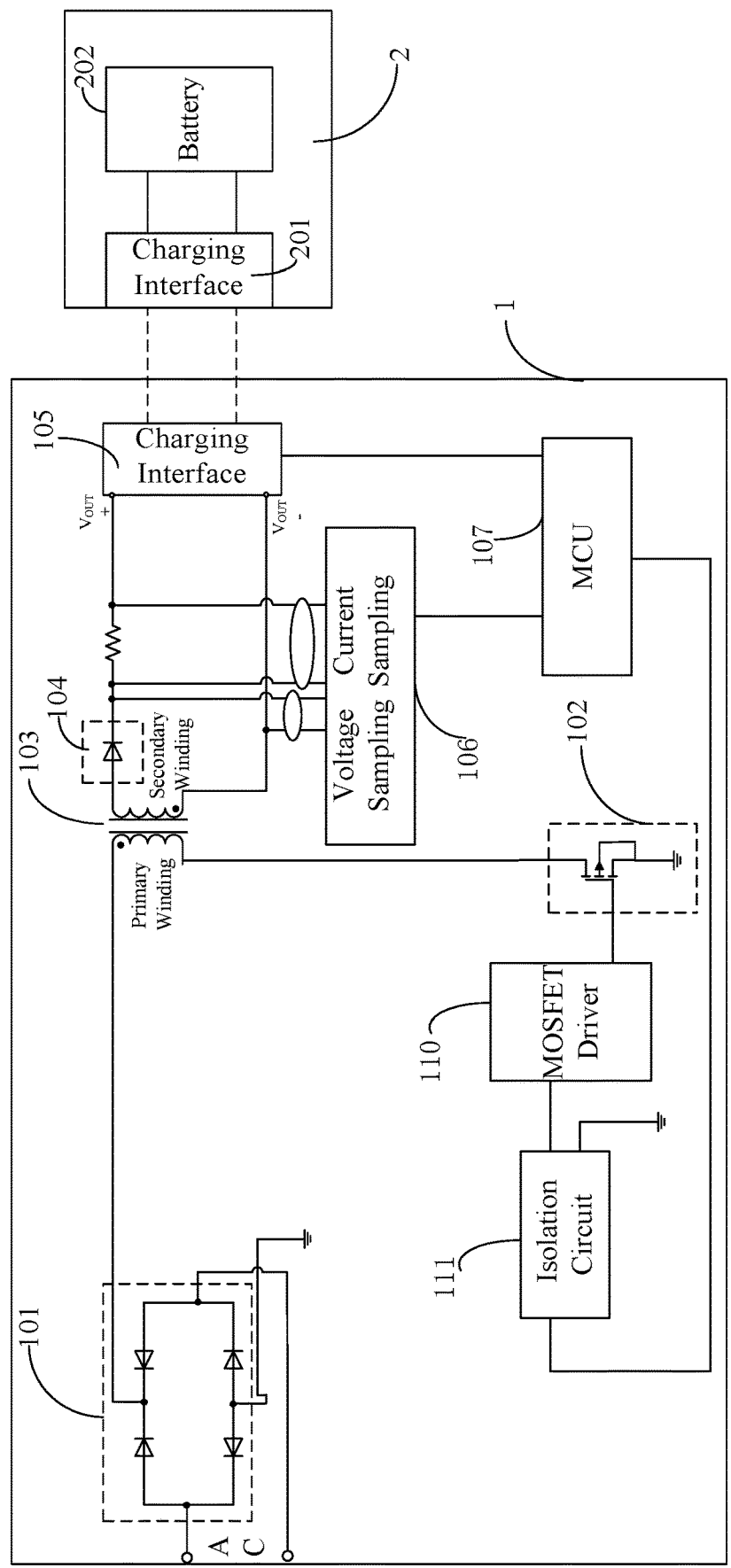
FIG. 8 illustrates a block schematic diagram of a charging system for a terminal according to another embodiment of the present disclosure.

In greater detail, in one embodiment of the present disclosure, the power adapter 1 further includes a drive circuit 110, such as a MOSFET driver, as shown in FIG. 8. The drive circuit 110 is connected between the switch circuit 102 and the control circuit 107. The drive circuit 110 is configured to drive the switch circuit 102 to turn on or turn off based on a control signal. Of course, it is noted that the drive circuit 110 may be integrated in the control circuit 107 according to other embodiments of the present disclosure.

As shown in FIG. 8, the power adapter 1 further includes an isolation circuit 111. The isolation circuit 111 is connected between the drive circuit 110 and the control circuit 107 to achieve signal isolation between a primary side and a secondary side of the power adapter 1 (or signal isolation between a primary winding and a secondary winding of the transformer 103). The isolation circuit 111 may use an optocoupler isolation, or may use some other isolation. Through disposing the isolation circuit 111, the control circuit 107 can be disposed on the secondary side of the power adapter 1 (or a secondary winding side of the transformer 103) to facilitate the control circuit 107 to communicate with the terminal 2. As a result, the space design of the power adapter 1 becomes simpler and easier.

In other embodiments of the present disclosure, both the control circuit 107 and the drive circuit 110 can be disposed on the primary side. Under the circumstances, the isolation circuit 111 can be disposed between the control circuit 107 and the sampling circuit 106 to achieve the signal isolation between the primary side and the secondary side of the power adapter 1.

In one embodiment of the present disclosure, the isolation circuit 111 needs to be disposed when the control circuit 107 is disposed on the secondary side. The isolation circuit 111 may be integrated in the control circuit 107. In other words, when a signal is transmitted from the primary side to the secondary side or from the secondary side to the primary side, the isolation circuit usually needs to be disposed to perform signal isolation.

Figure 9:
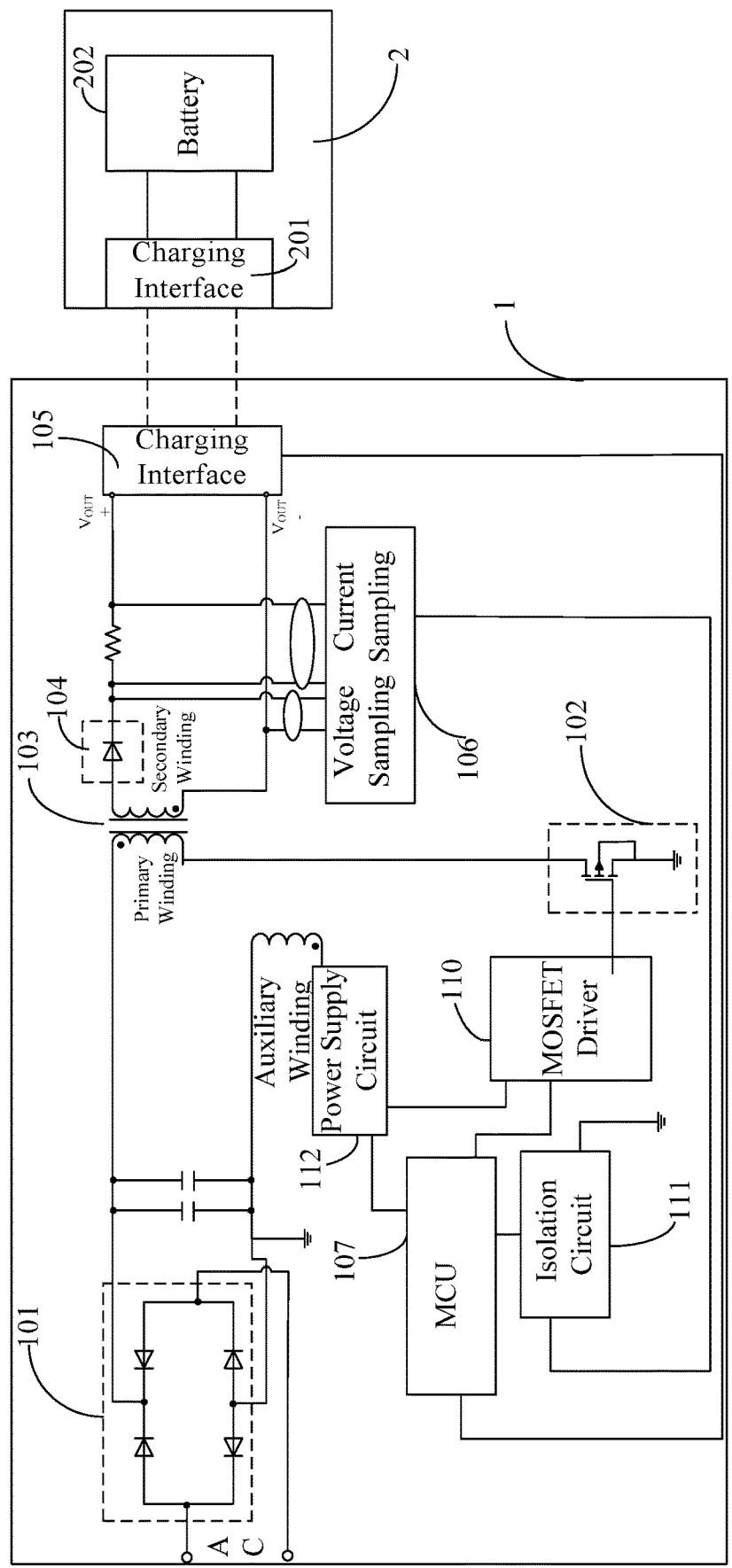
FIG. 9 illustrates a block schematic diagram of a charging system for a terminal according to still another embodiment of the present disclosure.

In one embodiment of the present disclosure, as shown in FIG. 9, the power adapter 1 further includes an auxiliary winding and a power supply circuit 112. The auxiliary winding generates voltage in a fourth pulsating waveform based on the voltage in the first pulsating waveform that is modulated. The power supply circuit 112 is connected to the auxiliary winding. The power supply circuit 112 (for example, including a filter regulator module, a voltage conversion module, etc.) is configured to convert the voltage in the fourth pulsating waveform to output DC power so as to supply power to the drive circuit 110 and/or the control circuit 107. The power supply circuit 112 may be constituted by elements, such as a small filter capacitor, a voltage regulator chip, etc., to process and convert the voltage in the fourth pulsating waveform, thus outputting a low voltage DC power, such as 3.3V, or 5V, etc.

In other words, a power supply of the drive circuit 110 can be obtained through converting the voltage in the fourth pulsating waveform by the power supply circuit 112. When the control circuit 107 is disposed on the primary side, a power supply of the control circuit 107 can be obtained through converting the voltage in the fourth pulsating waveform by the power supply circuit 112. As shown in FIG. 9, when the control circuit 107 is disposed on the primary side, the power supply circuit 112 provides a two-way DC output to respectively supply power to the drive circuit 110 and the control circuit 107. The isolation circuit 111, e.g. an optocoupler, is disposed between the control circuit 107 and the sampling circuit 106 to achieve the signal isolation between the primary side and the secondary side of the power adapter 1.

When the control circuit 107 is disposed on the primary side and is integrated with the drive circuit 110, the power supply circuit 112 only supplies power to the control circuit 107. When the control circuit 107 is disposed on the secondary side and the drive circuit 110 is disposed on the primary side, the power supply circuit 112 only supplies power to the drive circuit 110. The power of the control circuit 107 is supplied by the secondary side, for example, a power supply circuit is used to convert the voltage in the third pulsating waveform output from the second rectifying circuit 104 to a DC power so as to supply power to the control circuit 107.

In one embodiment of the present disclosure, output terminals of the first rectifying circuit 101 are further connected in parallel with a plurality of small capacitors to have a filtering effect. Or, the output terminals of the first rectifying circuit 101 are connected to an LC filter circuit.

Figure 10:
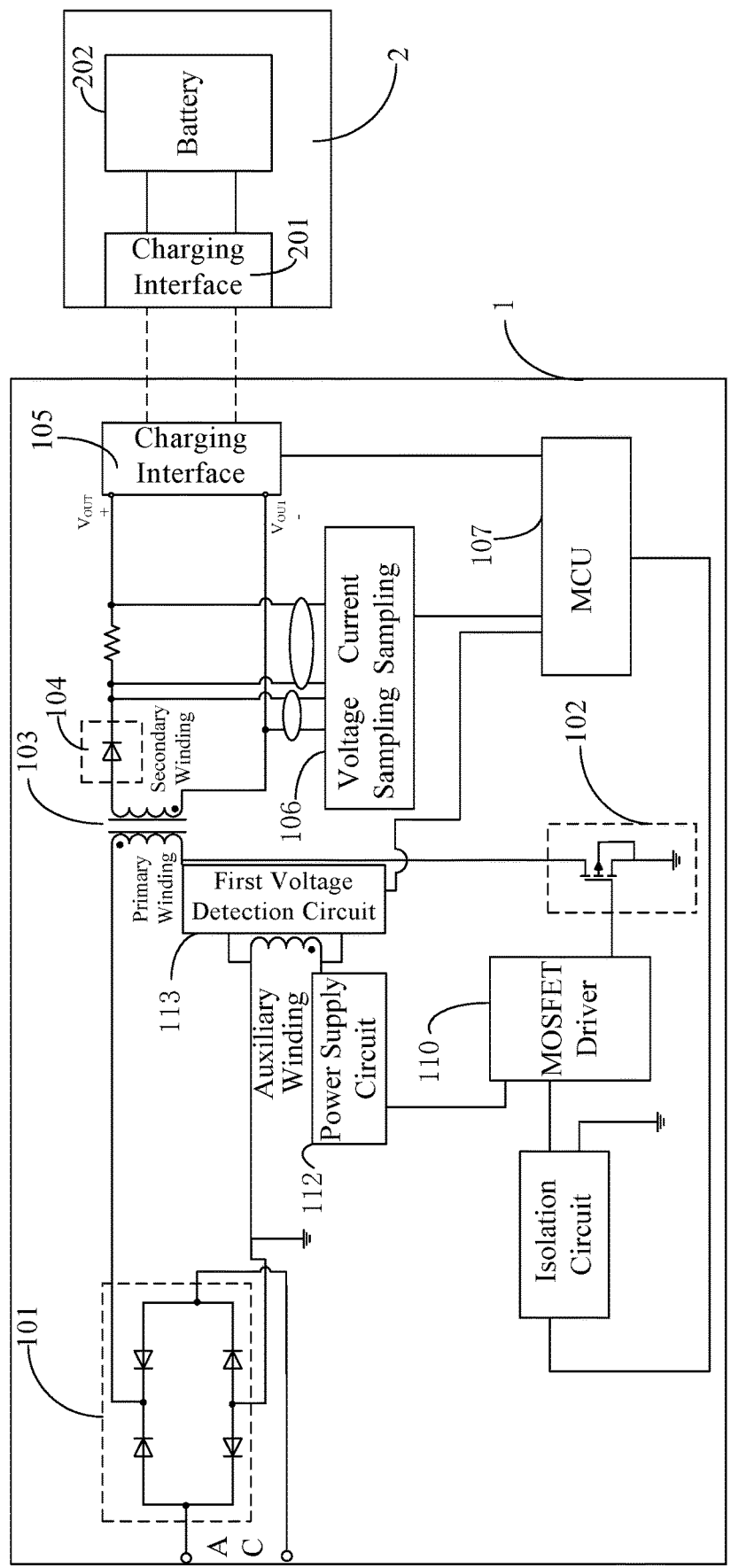
FIG. 10 illustrates a block schematic diagram of a charging system for a terminal according to yet another embodiment of the present disclosure.

In another embodiment of the present disclosure, the power adapter 1 further includes a first voltage detection circuit 113 as shown in FIG. 10. The first voltage detection circuit 113 is connected to the auxiliary winding and the control circuit 107. The first voltage detection circuit 113 is configured to detect the voltage in the fourth pulsating waveform to generate a voltage detection value. The control circuit 107 is further configured to modulate a duty cycle of a control signal based on the voltage detection value.

In other words, the control circuit 107 can reflect voltage output from the second rectifying circuit 104 based on voltage output from the auxiliary winding detected by the voltage detection circuit 113, and then modulate the duty cycle of the control signal based on the voltage detection value, so that the output of the second rectifying circuit 104 matches the charging requirement of the battery.

Figure 11:
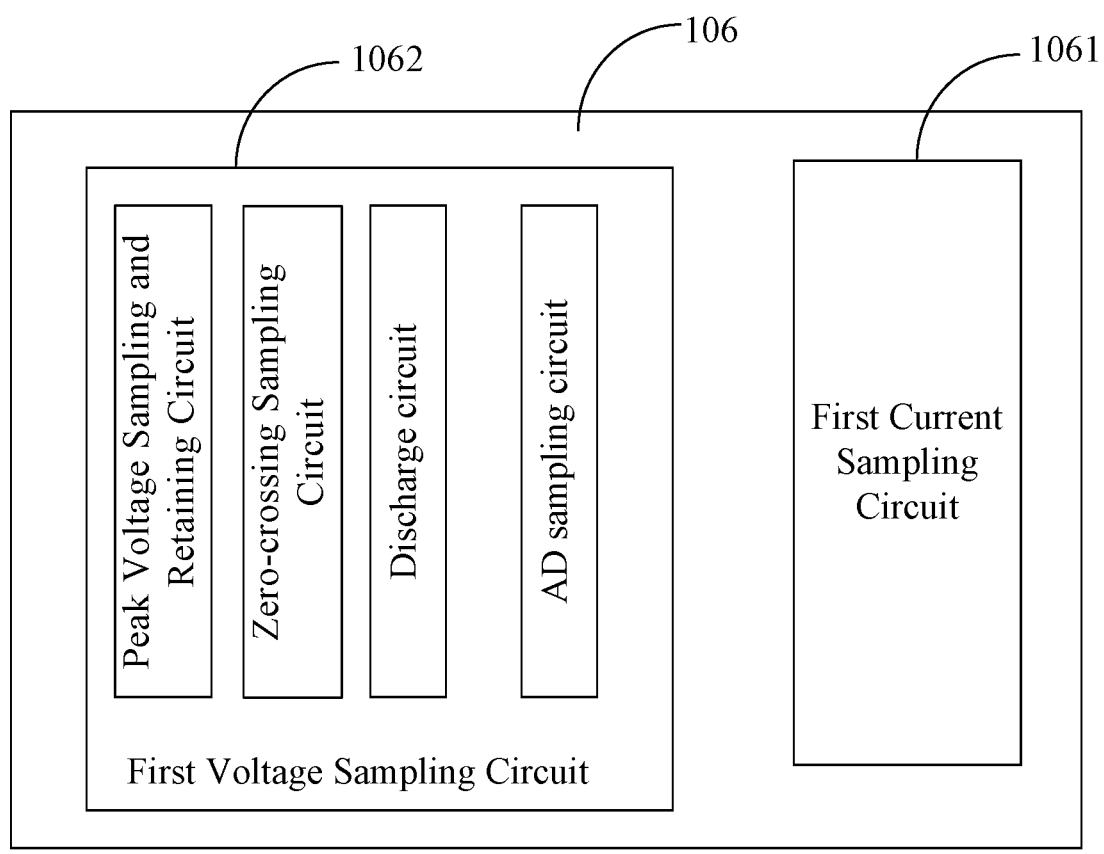
FIG. 11 illustrates a block schematic diagram of a sampling circuit according to one embodiment of the present disclosure.

In greater detail, in one embodiment of the present disclosure, the sampling circuit 106 includes a first current sampling circuit 1061 and a first voltage sampling circuit 1062 as shown in FIG. 11. The first current sampling circuit 1061 is configured to sample a current output from the second rectifying circuit 104 to obtain a current sampling value. The voltage sampling circuit 1062 is configured to sample voltage output from the second rectifying circuit 104 to obtain voltage sampling value.

Optionally, the first current sampling circuit 1061 can sample voltage across a resistor (current sensing resistor) connected to the first output terminal of the second rectifying circuit 104 to achieve the sampling of the current output from the second rectifying circuit 104. The first voltage sampling circuit 1062 can sample voltage between the first output terminal and a second output terminal of the second rectifying circuit 104 to achieve the sampling of the voltage output from the second rectifying circuit 104.

In one embodiment of the present disclosure, the first voltage sampling circuit 1062 includes a peak voltage sampling and retaining circuit, a zero-crossing sampling circuit, a discharge circuit, and an analog/digital (AD) sampling circuit as shown in FIG. 11. The peak voltage sampling and retaining circuit is configured to sample and retain a peak voltage of the voltage in the third pulsating waveform. The zero-crossing sampling circuit is configured to sample zero-crossing points of the voltage in the third pulsating waveform. The discharge circuit is configured to discharge the peak voltage sampling and retaining circuit at the zero-crossing points. The AD sampling circuit is configured to sample the peak voltage in the peak voltage sampling and retaining circuit so as to obtain the voltage sampling value.

Through disposing the peak voltage sampling and retaining circuit, the zero-crossing sampling circuit, the discharge circuit, and the AD sampling circuit in the first voltage sampling circuit 1062, accurate sampling of the voltage output from the second rectifying circuit 104 can be achieved. In addition, the voltage sampling value can be ensured to be synchronized with the voltage in the first pulsating waveform, that is, the phases are synchronous and the amplitude change trends are consistent.

Figure 12:
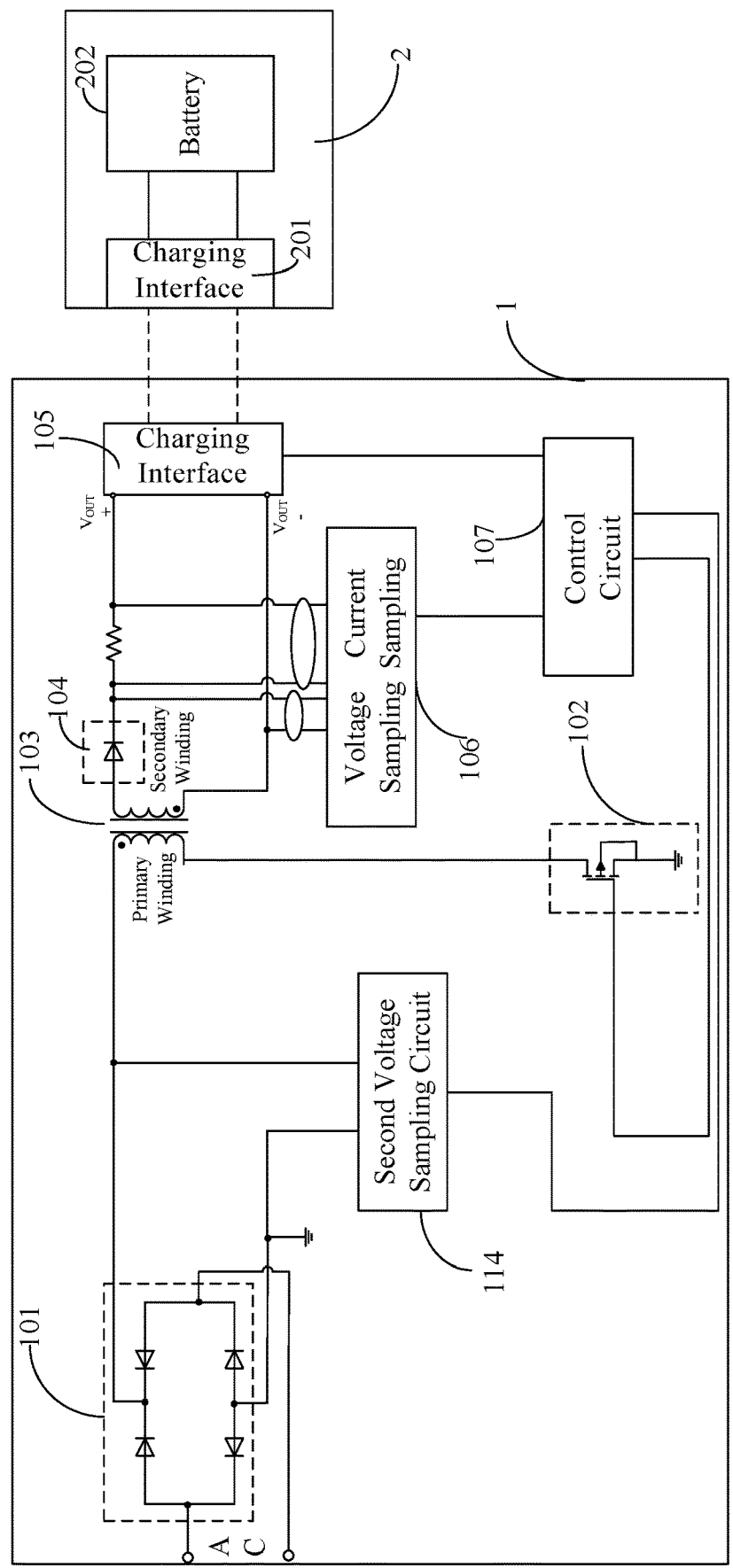
FIG. 12 illustrates a block schematic diagram of a charging system for a terminal according to an additional embodiment of the present disclosure.

According to one embodiment of the present disclosure, the power adapter 1 further includes a second voltage sampling circuit 114 as shown in FIG. 12. The second voltage sampling circuit 114 is configured to sample the voltage in the first pulsating waveform. The second voltage sampling circuit 114 is connected to the control circuit 107. When a voltage value sampled by the second voltage sampling circuit 114 is greater than a first predetermined voltage value, the control circuit 107 controls the switch circuit 102 to turn on for a first predetermined time so as to discharge a surge voltage, a spike voltage, etc. in the first pulsating waveform.

As shown in FIG. 12, the second voltage sampling circuit 114 may be connected to a first output terminal and a second output terminal of the first rectifying circuit 101 to achieve the sampling of the voltage in the first pulsating waveform. The control circuit 107 makes a judgment on the voltage value sampled by the second voltage sampling circuit 114. If the voltage value sampled by the second voltage sampling circuit 114 is greater than the first predetermined voltage value, the power adapter 1 is interfered with by a lighting stroke so the surge voltage appears. At This time, the surge voltage needs to be discharged to ensure the safety and reliability of charging. The control circuit 107 controls the switch circuit 102 to turn on for a period of time to form a discharge path. The surge voltage caused by the lighting stroke is discharged to prevent interference caused by the lighting stroke when the power adapter charges the terminal. As a result, the safety and reliability of charging the terminal is effectively improved. The first predetermined voltage value may be set depending on practical situations.

In one embodiment of the present disclosure, during the process that the power adapter charges the battery 202 of the terminal 2, the control circuit 107 is further configured to control the switch circuit 102 to turn off when a voltage value sampled by the sampling circuit 106 is greater than a second predetermined voltage value. That is, the control circuit 107 further makes a judgment on a magnitude of the voltage value sampled by the sampling circuit 106. If the voltage value sampled by the sampling circuit 106 is greater than a second predetermined voltage value, voltage output from the power adapter 1 is excessively high. At this time, the control circuit 107 controls the switch circuit 102 to turn off so that the power adapter 1 stops charging the battery 202 of the terminal 2. In other words, the control circuit 107 achieves the overvoltage protection of the power adapter 1 through controlling the switch circuit 102 to turn off so as to ensure safe charging.

In one embodiment of the present disclosure, the controller 204 performs the bidirectional communication with the control circuit 107 to acquire the voltage value sampled by the sampling circuit 106 (see FIG. 13 and FIG. 14), and controls the charging control switch 203 to turn off when the voltage value sampled by the sampling circuit 106 is greater than the second predetermined voltage value. That is, the charging control switch 203 is turned off through a side of the terminal 2 so as to turn off the charging process of the battery 202. The charging safety is ensured.

In addition, the control circuit 107 is further configured to control the switch circuit 102 to turn off when a current value sampled by the sampling circuit 106 is greater than a predetermined current value. That is, the control circuit 107 further makes a judgment on a magnitude of the current value sampled by the sampling circuit 106. If the current value sampled by the sampling circuit 106 is greater than the predetermined current value, a current output from the power adapter 1 is excessively high. At this time, the control circuit 107 controls the switch circuit 102 to turn off so that the power adapter 1 stops charging the terminal 2. In other words, the control circuit 107 achieves the overcurrent protection of the power adapter 1 through controlling the switch circuit 102 to turn off so as to ensure safe charging.

Similarly, the controller 204 performs the bidirectional communication with the control circuit 107 to acquire the current value sampled by the sampling circuit 106 (see FIG. 13 and FIG. 14), and controls the charging control switch 203 to turn off when the current value sampled by the sampling circuit 106 is greater than the predetermined current value. That is, the charging control switch 203 is turned off through the side of the terminal 2 so as to turn off the charging process of the battery 202. The charging safety is ensured.

Both the second predetermined voltage value and the predetermined current value may be set or written to a memory of the control circuit (for example, in the control circuit 107 of the power adapter 1, such as a micro controller unit (MCU)) depending on practical situations.

In one embodiment of the present disclosure, the terminal may be a mobile terminal, such as a cellphone, a mobile power supply; such as a charging bank, a multimedia player, a notebook computer, or a wearable device, etc.

According to the embodiment of the present disclosure, the charging system for the terminal controls the power adapter to output the voltage in the third pulsating waveform, and directly applies the voltage in the third pulsating waveform output from the power adapter to the battery in the terminal, so that the fast charging of the battery directly by the output voltage/current that is pulsating can be achieved. A magnitude of the output voltage/current that is pulsating changes periodically. As compared with the disclosures of charging with constant voltage and constant current in the related art, the lithium precipitation phenomenon of the lithium battery can be reduced. The service life of the battery can be improved. In addition, the probability of arcing and the strength of the contact at the charging interface can further be reduced to improve the life of the charging interface. It is also advantageous in reducing the polarization effect of the battery, improving the charging speed, reducing the battery heat so as to ensure the safety and reliability when the terminal is charged. Additionally, because the power adapter outputs the voltage in the pulsating waveform, there is no necessity to dispose electrolytic capacitors in the power supply adapter. Not only can the power adapter simplified and miniaturized, but the cost can also be greatly reduced.

Additionally; the embodiment of the present disclosure also provides a power adapter. The power adapter includes a first rectifying circuit, a switch circuit, a transformer, a second rectifying circuit, a first charging interface, a sampling circuit, and a control circuit. The first rectifying circuit rectifies an input AC power to output voltage in a first pulsating waveform during a charging process. The second rectifying circuit rectifies voltage coupled from a primary side to a secondary side. A waveform of a current output after being rectified by the second rectifying circuit has a same period as the first pulsating waveform, or an envelope of the waveform of the current output after being rectified by the second rectifying circuit has a same period as the first pulsating waveform. The switch circuit is configured to modulate the voltage in the first pulsating waveform based on a control signal. The transformer is configured to output voltage in a second pulsating waveform based on the voltage in the first pulsating waveform that is modulated. The second rectifying circuit is configured to rectify the voltage in the second pulsating waveform to output voltage in a third pulsating waveform. The first charging interface is connected to the second rectifying circuit and is configured to apply the voltage in the third pulsating waveform to a battery of a terminal via a second charging interface of the terminal when the first charging interface connected to the second charging interface. The second charging interface connects the battery. The sampling circuit is configured to sample voltage and/or current output from the second rectifying circuit to obtain a voltage sampling value and/or a voltage sampling value. The control circuit is connected to the sampling circuit and the switch circuit. The control circuit outputs the control signal to the switch circuit, and modulates a duty cycle of the control signal based on the voltage sampling value and/or the current sampling value so that the voltage in the third pulsating waveform satisfies a charging requirement.

According to the embodiment of the present disclosure, the power adapter output the voltage in the third pulsating waveform via the first charging interface, and directly applies the voltage in the third pulsating waveform output to the battery in the terminal, so that the fast charging of the battery directly by the output voltage/current that is pulsating can be achieved. A magnitude of the output voltage/current that is pulsating changes periodically. As compared with the disclosures of charging with constant voltage and constant current in the related art, the lithium precipitation phenomenon of the lithium battery can be reduced. The service life of the battery can be improved. In addition, the probability of arcing and the strength of the contact at the charging interface can further be reduced to improve the life of the charging interface. It is also advantageous in reducing the polarization effect of the battery, improving the charging speed, reducing the battery heat so as to ensure the safety and reliability when the terminal is charged. Additionally, because the power adapter outputs the voltage in the pulsating waveform, there is no necessity to dispose electrolytic capacitors in the power supply adapter. Not only call the power adapter simplified and miniaturized, but the cost can also be greatly reduced.

Figure 15:
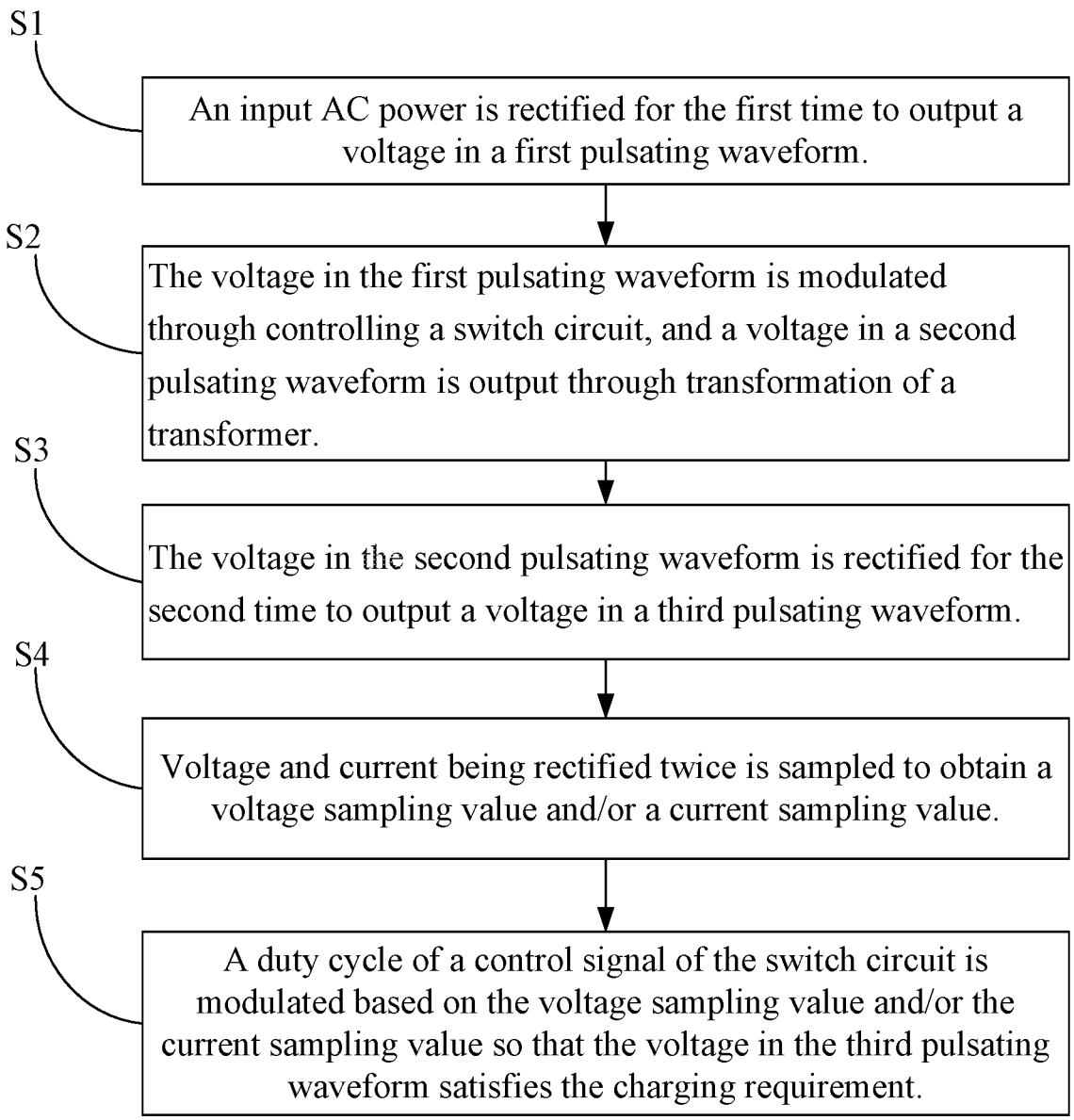
FIG. 15 illustrates a flowchart of a charging method a terminal according to one embodiment of the present disclosure.

FIG. 15 illustrates a flowchart of a charging method for a terminal according to one embodiment of the present disclosure. As shown in FIG. 15, the charging method for the terminal can begin at block S1.

At block S1, an AC power input to a power adapter is rectified for the first time to output voltage in a first pulsating waveform when a first charging interface of the power adapter is connected to a second charging interface of a terminal.

That is, a first rectifying circuit in the power adapter is used to rectify AC mains of an input AC power (that is, mains, such as 220V, 50 Hz or 60 Hz) and output voltage in a clipped pulsating waveform of the voltage in the first pulsating waveform (such as 100 Hz or 1.20 Hz).

At block S2, a switch circuit is controlled to modulate the voltage in the first pulsating waveform, and voltage in a second pulsating waveform is output through transformation of a transformer.

The switch circuit may be constituted by a MOS transistor. A peak clipping modulation is performed to the voltage in the clipped pulsating waveform through performing a PWM control to the MOS transistor. Then, the voltage in the first pulsating waveform thus modulated is coupled to a secondary side by the transformer, and the voltage in the second pulsating waveform is output by a secondary winding.

In one embodiment of the present disclosure, a high-frequency transformer may be adopted to perform transformation. In this manner, a size of the transformer can be very small, thus being able to achieve a high-power and small-sized design of the power adapter.

At block S3, the voltage in the second pulsating waveform is rectified for the second time to output voltage in a third pulsating waveform. The voltage in the third pulsating waveform can be applied to a battery of the terminal through the second charging interface to achieve the charging of the battery of the terminal.

In one embodiment of the present disclosure, the voltage in the second pulsating waveform is rectified for the second time through a second rectifying circuit. The second rectifying circuit may be constituted by a diode or a MOS transistor to achieve secondary synchronous rectification so that the modulated first pulsating waveform is synchronized with the third pulsating waveform.

At block S4, voltage and/or current being rectified twice is sampled to obtain a voltage sampling value and/or a current sampling value.

At block S5, a duty cycle of a control signal of the switch circuit is modulated based on the voltage sampling value and/or the current sampling value so that the voltage in the third pulsating waveform satisfies the charging requirement.

It is noted that the voltage in the third pulsating waveform satisfying the charging requirement refers to that the voltage and a current in the third pulsating waveform satisfy a charging voltage and a charging current when the battery is charged. That is, the duty cycle of the control signal, such as a PWM signal, can be modulated based on voltage and/or current output from the power adapter thus sampled to adjust an output of the power adapter in a real-time manner. A closed-loop regulation control is thus realized so that the voltage in the third pulsation waveform satisfies the charging requirement of the terminal to ensure that the battery is safely and reliably charged. The charging voltage waveform output to the battery being regulated through the duty cycle of the PWM signal is shown in FIG. 3. The charging current waveform output to the battery being regulated through the duty cycle of the PWM signal is shown in FIG. 4.

Hence, according to the embodiment of the present disclosure, the voltage in the first pulsation waveform, that is, the voltage in the clipped pulsating waveform, which is rectified by a full bridge is directly modulated by performing PWM peak clipping through controlling the switch circuit, and delivered to the high-frequency transformer to be coupled from a primary side to the secondary side through the high-frequency transformer, and then be recovered as the voltage/current in the clipped pulsating waveform through synchronous rectification to be directly delivered to the battery of the terminal so as to achieve the fast charging of the battery. An amplitude of the voltage in the clipped pulsating waveform can be regulated through adjusting the duty cycle of the PWM signal. As a result, the output of the power adapter satisfies the charging requirement of the battery. It can be seen that the electrolytic capacitors on the primary side and the secondary side in the power adapter can be removed. Through using the voltage in the clipped pulsating waveform to directly charge the battery, the size of the power adapter can be reduced to miniaturize the power adapter and significantly reduce the cost.

According to one embodiment of the present disclosure, a frequency of the control signal is modulated based on the voltage sampling value and/or the current sampling value. The PWM signal output to the switch circuit can thus be controlled to be continuously output for a period of time and then be stopped. After the output has been stopped for a predetermined time, the output of the PWM is turned on again. In this manner, the voltage applied to the battery is intermittent and the battery is intermittently charged. As a result, the security worry caused by serious heating when the battery is continuously charged can be avoided to improve the reliability and safety of battery charging. The control signal output to the switch circuit may be shown in FIG. 5.

In addition to that, the charging method for the terminal further includes: state information of the terminal is acquired through a communication between the first charging interface and the terminal so as to modulate the duty cycle of the control signal based on the state information of the terminal, and/or the voltage sampling value and/or the current sampling value.

In other words, when the second charging interface is connected to the first charging interface, the power adapter and the terminal can send a communication inquiry instruction to each other, and establish a communication connection between the power adapter and the terminal after receiving a reply instruction correspondingly. In this manner, the state information of the terminal can be acquired so that the power adapter negotiates a charging triode and charging parameters (such as the charging current, the charging voltage) with the terminal and controls the charging process.

According to one embodiment of the present disclosure, voltage in a fourth pulsating waveform is generated through transformation of the transformer, and the voltage in the fourth pulsating waveform is detected to generate a voltage detection value so as to modulate the duty cycle of the control signal based on the voltage detection value.

In greater detail, an auxiliary winding may be further disposed in the transformer. The auxiliary winding can generate the voltage in the fourth pulsating waveform based on the modulated first pulsating waveform. In this manner, an output voltage of the power adapter can be reflected through detecting the voltage in the fourth pulsating waveform so as to modulate the duty cycle of the control signal based on the voltage detection value. As a result, the output of the power adapter matches the charging requirement of the battery.

In one embodiment of the present disclosure, sampling the voltage that has been rectified twice to obtain the voltage sampling value includes: a peak voltage of the voltage that has been rectified twice is sampled and retained and zero-crossing points of the voltage that has been rectified twice are sampled; a peak voltage sampling and retaining circuit that samples and retains the peak voltage is discharged at the zero-crossing points; the peak voltage in the peak voltage sampling and retaining circuit is sampled to obtained the voltage sampling value. Hence, accurate sampling of the voltage output from the power adapter can be achieved. In addition, the voltage sampling value can be ensured to be synchronized with the voltage in the first pulsating waveform, that is, the phases the amplitude change trends are consistent.

Moreover, in one embodiment of the present disclosure, the charging method for the terminal further includes: the voltage in the first pulsating waveform is sampled and the switch circuit is controlled to turned on for a first predetermined time to discharge a surge voltage in the first pulsating waveform when a voltage value thus sampled is greater than a first predetermined voltage value.

Through sampling the voltage in the first pulsating waveform and then making a judgment on a sampled voltage value, the power adapter is interfered with by a lighting stroke so the surge voltage appears if the sampled voltage value is greater than the first predetermined voltage value. At this time, the surge voltage needs to be discharged to ensure the safety and reliability of charging. The switch circuit needs to be controlled to turn on for a period of time to form a discharge path. The surge voltage caused by the lighting stroke is discharged to prevent interference caused by the lighting stroke when the power adapter charges the terminal. As a result, the safety and reliability of charging the terminal is effectively improved. The first predetermined voltage value may be set depending on practical situations.

According to one embodiment of the present disclosure, the charging mode is further determined through a communication between the first charging interface and the terminal, and a charging current and/or a charging voltage corresponding to a fast charging mode is obtained based on the state information of the terminal when the charging mode is determined to be the fast charging mode. The duty cycle of the control signal is thus modulated based on the charging current and/or the charging voltage corresponding to the fast charging mode. The charging mode includes the fast charging mode and a normal charging mode.

In other words, when a current charging mode is determined to be the fast charging mode, the charging current and/or the charging voltage corresponding to the fast charging mode can be obtained based on acquired state information of the terminal, such as a battery voltage, a battery level, a battery temperature, operating parameters of the terminal, and power consumption information of an application running on the terminal, etc. Then, the duty cycle of the control signal is modulated based on the obtained charging current and/or charging voltage. As a result, the output of the power adapter satisfies the charging requirement to achieve the fast charging of the battery.

The state information of the terminal includes the battery temperature. In addition, when the battery temperature is higher than a first predetermined threshold temperature or lower than a second predetermined threshold temperature, the fast charging mode is switched to the normal charging mode if the current charging mode is the fast charging mode. The first predetermined threshold temperature is higher the second predetermined threshold temperature. In other words, when the battery temperature is excessively low (for example, the battery temperature is lower than the second predetermined threshold temperature) or excessively high (for example, the battery temperature is higher than the first predetermined threshold temperature), neither is suitable for fast charging. Therefore, the fast charging mode needs to be switched to the normal charging mode. In the embodiment of the present disclosure, the first predetermined threshold temperature and the second predetermined threshold temperature may be set depending on practical situations.

In one embodiment of the present disclosure, the switch circuit is controlled to turn off when the battery temperature is higher than a high temperature protection threshold that is predetermined. That is, a high temperature protection strategy needs to be adopted to control the switch circuit to turn off when the battery temperature exceeds the high temperature protection threshold, so that the power adapter stops charging the battery. The high temperature protection of battery is thus achieved to improve charging safety. The high temperature protection threshold may be different from the first predetermined threshold temperature, or may be the same as the first predetermined threshold temperature. In at least one embodiment, the high temperature protection threshold is higher than the first predetermined threshold temperature.

In another embodiment of the present disclosure, the terminal further acquires the battery temperature, and controls the battery by stopping the charging when the battery temperature is higher than the high temperature protection threshold that is predetermined. That is, a charging control switch can be turned off through a terminal side to end the charging process of the battery so as to ensure charging safety.

In one embodiment of the present disclosure, the charging method for the terminal further includes: a temperature of the first charging interface is acquired, and the switch circuit is controlled to turned off when the temperature of the first charging interface is higher than a predetermined protection temperature. That is, the control circuit also needs to execute the high temperature protection strategy to control the switch circuit to turn off when the temperature of the first charging interface exceeds a certain temperature, so that the power adapter stops charging the battery. The high temperature protection of charging interface is thus achieved to improve the charging safety.

In another embodiment of the present disclosure, the terminal acquires the temperature of the first charging interface by performing a bidirectional communication with the power adapter through the second charging interface, and controls the battery by stopping the charging when the temperature of the first charging interface is higher than the predetermined protection temperature. That is, the charging control switch can be turned off through the terminal side to end the charging process of the battery so as to ensure charging safety.

During the process that the power adapter charges the terminal, the switch circuit is controlled to turn off when the voltage sampling value is greater than a second predetermined voltage value. That is, during the process that the power adapter charges the terminal, a judgment is further made on a magnitude of the voltage sampling value if the voltage sampling value is greater than the second predetermined voltage value, the voltage output from the power adapter is excessively high. At this time, the switch circuit is controlled to turn off so that the power adapter stops charging the terminal. In other words, the overvoltage protection of the power adapter is achieved through controlling the switch circuit to turn off so as to ensure safe charging.

In one embodiment of the present disclosure, the terminal acquires the voltage sampling value by performing the bidirectional communication with the power adapter through the second charging interface, and controls the battery by stopping the charging when the voltage sampling value is greater than the second predetermined voltage value. That is, the charging control switch can be turned off through the terminal side so as to end the charging process of the battery. The charging safety is ensured.

In one embodiment of the present disclosure, during the process that the power adapter charges the terminal, the switch circuit is controlled to turn off when the current sampling value is greater than a predetermined current value. That is, during the process that the power adapter charges the terminal, a judgment is further made on a magnitude of the current sampling value. If the current sampling value is greater than the predetermined current value, the current output from the power adapter is excessively high. At this time, the switch circuit is controlled to turn off so that the power adapter stops charging the terminal. In other words, the overcurrent protection of the power adapter is achieved through controlling the switch circuit to turn off so as to ensure safe charging.

Similarly, the terminal acquires the current sampling value by performing the bidirectional communication with the power adapter through the second charging interface, and controls the battery by stopping the charging when the current sampling value is greater than the predetermined current value. That is, the charging control switch can be turned off through the terminal side so as to end the charging process of the battery. The charging safety is ensured.

Both the second predetermined voltage value and the predetermined current value may be set depending on practical situations.

In one embodiment of the present disclosure, the state information of the terminal comprises a battery level, a battery temperature, voltage/current of the terminal, interface information of the terminal, or path impedance information of the terminal.

In greater detail, the power adapter and the terminal are connected through a universal serial bus (USB) interface. The USB interface may be a normal USB interface, or may be a micro USB interface. Data lines in the USB interface are the data lines in the first charging interface and are configured to provide a bidirectional communication between the power adapter and the terminal. The data lines may be a D+ line and/or a D− line in the USB interface, and the bidirectional communication can refer to the information exchange between the power adapter and the terminal.

The power adapter performs the bidirectional communication with the terminal through the data lines in the USB interface to determine that the terminal is charged by the fast charging mode.

Optionally, in some embodiments, when a bidirectional communication between the terminal and the first charging interface is established to determine that the terminal is charged by the fast charging mode, a first instruction, configured to inquire of the terminal whether to enable the fast charging mode or not, is sent to the terminal by the power adapter, and a reply instruction responsive to the first instruction from the terminal, configured to indicate that the terminal agrees to enable the fast charging mode, is received by the power adapter.

Optionally, in some embodiments, before sending the first instruction to the terminal, the power adapter charges the terminal through the normal charging mode, the first instruction is sent to the terminal if a charging time of the normal charging mode is longer than a predetermined threshold value.

It is noted that if a charging time of the normal charging mode is longer than a predetermined threshold value, the power adapter determines that the terminal has identified the power adapter and can enable fast charging inquiry.

Optionally, in some embodiments, before a charging current of the power adapter is adjusted to a charging current corresponding to the fast charging mode by controlling the switch circuit, and the power adapter uses the charging current corresponding to the first charging mode to charge the terminal, a charging voltage corresponding to the fast charging mode is determined through the bidirectional communication between the terminal and the power adapter via the first charging interface. The power adapter is controlled to adjust a charging voltage to the charging voltage corresponding to the fast charging mode.

Optionally, in some embodiments, the determining a charging voltage corresponding to the fast charging mode through the bidirectional communication between the terminal and the power adapter via, the first charging interface includes: a second instruction that is configured to inquire whether or not a current output voltage of the power adapter is suitable as a charging voltage of the fast charging mode is sent to the terminal by the power adapter, and a reply instruction responsive to the second instruction sent by the terminal is received by the power adapter. The reply instruction responsive to the second instruction is configured indicate that the current output voltage of the power adapter is suitable, excessively high, or excessively low. Then the charging voltage of the fast charging mode is determined by the power adapter based on the reply instruction responsive to the second instruction.

Optionally, in some embodiments, before the charging current of the power adapter is adjusted to the charging current corresponding to the fast charging mode, the charging current corresponding to the fast charging mode is determined through the bidirectional communication between the terminal and the power adapter via the first charging interface.

Optionally, in some embodiments, the determining the charging current corresponding to the fast charging mode through the bidirectional communication between the terminal and the power adapter via the first charging interface includes: a third instruction to the terminal is sent by the power adapter, a reply instruction responsive to the third instruction sent by the terminal is received by the power adapter, and a charging current of the fast charging mode is determined based on the reply instruction responsive to the third instruction. The third instruction is configured to inquire about a maximum charging current currently supported by the terminal. The reply instruction responsive to the third instruction configured to indicate the maximum charging current currently supported by the terminal.

The power adapter can set the maximum charging current as the charging current of the fast charging mode, or any charging current less than maximum charging current as the charging current of the fast charging mode.

Optionally, in some embodiments, during the process that the power adapter uses the fast charging mode to charge the terminal, the charging current output to the battery from the power adapter is continuously adjusted by controlling the switch circuit through the bidirectional communication between the terminal and the power adapter via the first charging interface.

The power adapter can continuously inquiry the current state information of the terminal, such as battery voltage or power volume of the battery, so as to continuously adjust the charging current.

Optionally, in some embodiments, the continuously adjusting the charging current output to the battery from the power adapter through controlling the switch circuit through the bidirectional communication between the terminal and the power adapter via the first charging interface, includes: a fourth instruction to the terminal is sent by the power adapter, a reply instruction responsive to the fourth instruction sent from the terminal is received by the power adapter, and the charging current is adjusted through controlling the switch circuit based on the current voltage of the battery. The fourth instruction is configured to inquire about a current voltage of the battery in the terminal. The reply instruction responsive to the fourth instruction configured to indicate the current voltage of the battery in the terminal.

Optionally, in some embodiments, the adjusting the charging current through controlling the switch circuit based on the current voltage of the battery, includes: the charging current output to the battery from the power adapter is adjusted to a charging current value corresponding to the current voltage of the battery through controlling the switch circuit based on the current voltage of the battery and a predetermined relationship between a battery voltage value and a charging current value.

Optionally, the power adapter can store a relationship between the battery voltage and charging current.

Optionally, in some embodiments, during the process that the power adapter uses the fast charging mode to charge the terminal, it is determined that whether there is a bad contact between the first charging interface and a second charging interface or not, through the bidirectional communication between the terminal and the power adapter via the first charging interface. The power adapter is controlled to exit the fast charging mode when it is determined that there is a bad contact between the first charging interface and the second charging interface.

Optionally, in some embodiments, before determining whether there is a bad contact between the first charging interface and the second charging interface or not, an information indicative of a path impedance of the terminal from the terminal is received. The receiving information indicative of a path impedance of the terminal from the terminal includes: a fourth instruction to the terminal is sent by the power adapter, a reply instruction responsive to the fourth instruction sent by the terminal is received by the power adapter, a path impedance from the power adapter to the battery is determined based on an output voltage of the power adapter and the voltage of the battery, and it is determined whether there is a bad contact between the first charging interface and the second charging interface or not based on the path impedance from the power adapter to the battery, the path impedance of the terminal, and a path impedance of charging lines between the power adapter and the terminal. The fourth instruction is configured to inquire about voltage of the battery in the terminal. The reply instruction responsive to the fourth instruction is configured to indicate the voltage of the battery in the terminal.

Optionally, in some embodiments, before the power adapter is controlled to exit the fast charging mode, a fifth instruction is sent to the terminal. The fifth instruction is configured to indicate that there is a bad contact between the first charging interface and the second charging interface.

After sending the fifth instruction, the power adapter can exit rapidly and reset.

The description of fast charging process in the above paragraphs is in view of the power adapter. The following describes the fast charging process in view of the terminal.

According to the present disclosure, the terminal supports the normal charging mode and the fast charging mode. A charging current of the fast charging mode is greater than a charging current of the normal charging mode. The power adapter determines that the fast charging mode is used to charge the terminal, through the bidirectional communication between the second charging interface of the terminal and the adapter. The power adapter outputs the charging current corresponding to the fast charging mode to charge the battery in the terminal.

Optionally, in some embodiments, determining that the fast charging mode is used to charge the terminal, through the bidirectional communication between the second charging interface of the terminal and the adapter, includes: the terminal receives a first instruction sent from the power adapter, the first instruction configured to inquire of the terminal whether to enable the fast charging mode or not; the terminal sends a reply instruction responsive to the first instruction to the power adapter, the reply instruction responsive to the first instruction configured to indicate that the terminal agrees to enable the fast charging mode.

Optionally, in some embodiments, before receiving the first instruction sent from the power adapter, the power adapter charges the terminal through the normal charging mode. The terminal receives the first instruction sent from the power adapter if a charging time of the normal charging mode is longer than a predetermined threshold value.

Optionally, in some embodiments, before a charging current of the power adapter is adjusted to a charging current corresponding to the fast charging mode, and the power adapter uses the charging current corresponding to the fast charging mode to charge the terminal, the charging voltage corresponding to the fast charging mode is determined through the bidirectional communication between the power adapter and the second charging interface of the terminal.

Optionally, in some embodiments, determining the charging voltage corresponding to the fast charging mode through the bidirectional communication between the power adapter and the second charging interface of the terminal, includes: the terminal receives a second instruction sent by the power adapter, the second instruction configured to inquire whether or not a current output voltage of the power adapter is suitable as a charging voltage of the fast charging mode; the terminal sends a reply instruction responsive to the second instruction to the power adapter, the reply instruction responsive to the second instruction configured to indicate that the current output voltage of the power adapter is suitable, excessively high, or excessively low.

Optionally, in some embodiments, before the charging current of the power adapter is adjusted to the charging current corresponding to the fast charging mode, and the terminal uses the charging current corresponding to the fast charging mode to charge the battery, the power adapter determines the charging current corresponding to the fast charging mode through the bidirectional communication between the power adapter and the second charging interface of the terminal.

Optionally, in some embodiments, the power adapter determines the charging current corresponding to the fast charging mode through the bidirectional communication between the power adapter and the second charging interface of the terminal, includes: the terminal receives a third instruction sent by the power adapter, the third instruction configured to inquire about a maximum charging current currently supported by the terminal; the terminal sends a reply instruction responsive to the third instruction to the power adapter, the reply instruction responsive to the third instruction configured to indicate the maximum charging current currently supported by the terminal to allow the power adapter to determine the charging current corresponding to the fast charging mode based on the maximum charging current.

Optionally, in some embodiments, during the process that the power adapter uses the fast charging mode to charge the terminal, the power adapter continuously adjusts the charging current output to the battery from the power adapter through the bidirectional communication between the terminal and the power adapter via the first charging interface.

Optionally, in some embodiments, continuously adjusting the charging current output to the battery from the power adapter through the bidirectional communication between the terminal and the power adapter via the first charging interface, includes: the terminal receives a fourth instruction sent by the power adapter, the fourth instruction configured to inquire about a current voltage of the battery in the terminal; the terminal sends a reply instruction responsive to the fourth instruction to the power adapter, the reply instruction responsive to the fourth instruction configured to indicate the current voltage of the battery in the terminal to allow the power adapter to continuously adjust the charging current output to the battery from the power adapter based on the current voltage of the battery.

Optionally, in some embodiments, during the process that the power adapter uses the fast charging mode to charge the terminal, the power adapter determines whether there is a bad contact between the first charging interface and the second charging interface or not through the bidirectional communication between the second charging interface and the power adapter.

Optionally, in some embodiments, determining whether there is a bad contact between the first charging interface and the second charging interface or not through the bidirectional communication between the second charging interface and the power adapter, includes: the terminal receives a fourth instruction sent by the power adapter, the fourth instruction configured to inquire about a current voltage of the battery in the terminal; the terminal sends a reply instruction responsive to the fourth instruction to the control circuit, the reply instruction responsive to the fourth instruction configured to indicate the current voltage of the battery in the terminal to allow the power adapter to determine whether there is a bad contact between the first charging interface and the second charging interface or not based on the output voltage of the power adapter and the current voltage of the battery.

Optionally, in some embodiments, the terminal receives a fifth instruction sent by the power adapter. The fifth instruction is configured to indicate that there is a bad contact between the first charging interface and the second charging interface.

In order to enable the fast charging mode, the power adapter can perform a fast charging communication process with the terminal. Through one or more handshake negotiations, the fast charging of the battery is achieved. A detailed description of the fast charging communication process and various stages of the fast charging process according to the embodiment of the present disclosure is provided as follows with reference to FIG. 6. It should be understood that the communication steps or operations shown in FIG. 6 are merely examples, and the embodiment of the present disclosure may further perform other operations or variations of the various operations in FIG. 6. In addition, the various stages in FIG. 6 may be performed in an order different from that presented in FIG. 6, and it may not be necessary to perform all the operations in FIG. 6.

In summary, according to the embodiment of the present disclosure, the charging method for the terminal controls the power adapter to output the voltage in the third pulsating waveform that satisfies the charging requirement, and directly applies the voltage in the third pulsating waveform output from the power adapter to the battery in the terminal, so that the fast charging of the battery directly by the output voltage/current that is pulsating can be achieved. A magnitude of the output voltage/current that is pulsating changes periodically. As compared with the disclosure of charging with constant voltage and constant current in the related art, the lithium precipitation phenomenon of the lithium battery can be reduced. The service life of the battery can be improved. In addition, the probability of arcing and the strength of the contact at the charging interface can further be reduced to improve the life of the charging interface. It is also advantageous in reducing the polarization effect of the battery, improving the charging speed, reducing the battery heat so as to ensure the safety and reliability when the terminal is charged. Additionally, because the power adapter outputs the voltage in the pulsating waveform, there is no necessity to dispose electrolytic capacitors in the power adapter. Not only can the power adapter be simplified and miniaturized, but the cost can also be greatly reduced.

In the disclosure, it is should be understood that spatially relative terms, such as "center", "longitudinal", "lateral", "length", "width", "above", "below", "front", "back", "left", "right", "horizontal", "vertical", "top", "bottom", "inner", "outer", "clockwise", "counterclockwise", "axial", "radial", "circumferential", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. The spatially relative terms are not limited to specific orientations depicted in the figures.

In addition, the term "first", "second" are for illustrative purposes only and are not to be construed as indicating or imposing a relative importance or implicitly indicating the number of technical features indicated. Thus, a feature that limited by "first", "second" may, expressly or implicitly include at least one of the features. In the description of the present disclosure, the meaning of "plural" is two or more, unless otherwise specifically defined.

All of the terminologies containing one or more technical or scientific terminologies have the same meanings that persons skilled in the art understand ordinarily unless they are not defined otherwise. For example, "arrange," "couple," and "connect," should be understood generally in the embodiments of the present disclosure. For example, "firmly connect," "detachably connect," and "integrally connect" are all possible. It is also possible that "mechanically connect," "electrically connect," and "mutually communicate" are used. It is also possible that "directly couple," "indirectly couple via a medium," and "two components mutually interact" are used.

All of the terminologies containing one or more technical or scientific terminologies have the same meanings that persons skilled in the art understand ordinarily unless they are not defined otherwise. For example, "upper" or "lower" of a first characteristic and a second characteristic may include a direct touch between the first and second characteristics. The first and second characteristics are not directly touched; instead, the first and second characteristics are touched via other characteristics between the first and second characteristics. Besides, the first characteristic arranged on/above/over the second characteristic implies that the first characteristic arranged right above/obliquely above or merely means that the level of the first characteristic is higher than the level of the second characteristic. The first characteristic arranged under/below/beneath the second characteristic implies that the first characteristic arranged right under/obliquely under or merely means that the level of the first characteristic is lower than the level of the second characteristic.

In the description of this specification, the description of the terms "one embodiment", "some embodiments", "examples", "specific examples", or "some examples", and the like, means to refer to the specific feature, structure, material or characteristic described in connection with the embodiments or examples being included in at least one embodiment or example of the present disclosure. In the present specification, the term of the above schematic representation is not necessary for the same embodiment or example. Furthermore, the specific feature, structure, material, or characteristic described may be in combination in a suitable manner in any one or more of the embodiments or examples. In addition, it will be apparent to those skilled in the art that different embodiments or examples described in this specification, as well as features of different embodiments or examples, may be combined without contradictory circumstances.

One having ordinary skill in the art may be aware that the units and steps of algorithm in the examples of the embodiments published by this application can be realized by electronic hardware, or combinations of computer software and electronic hardware. Whether the functions should be performed by hardware or software should depend upon the particular applications and design constraints of a technical solution. One skilled in the art may use different methods to implement the described functions for each specific application, but such implementation should not be considered as outside of the scope of the present disclosure.

One skilled in the art may clearly understand that they can refer to the corresponding process in the abovementioned embodiments of the method for the specific operating process of the abovementioned system, device, and circuits. No description is provided herein again for the convenience and succinctness of the description.

In the several embodiments provided by the application, it should be understood that the revealed system, device and method may be implemented in other ways. For example, the abovementioned embodiments of the device are merely schematic. For example, the division of the circuits is merely a division based on logical functions; it may be different when they are put into practice. For example, a plurality of circuits or components may be combined or integrated into another system, or some features may be ignored or not be performed. And another point is that the displayed or discussed coupling, direct coupling or communication can be done through some interfaces, devices, or indirect coupling or communication between circuits; they may be electrical, mechanical, or in other forms.

The circuits described as separated parts may or may not be physically separated. A part that appeared as a circuit may or may not be a physical circuit, i.e. it can locate in one place, or it can be distributed to multiple network circuits. Part of or all of the circuits can be selected based on actual needs to achieve the object of the solutions of the present embodiments.

Furthermore, each of the functional circuits in the embodiments of the present disclosure may be integrated in one processing circuit, or may be independent circuits physically separated, or may integrate with another one or more circuits and appear as a single circuit.

If the function is realized as a software functional unit and used or sold as a standalone product, it may be stored in a computer-readable storage medium. Based on such understanding, the technical solutions of the present disclosure per se, or its contribution to the related art, or the technical solution may be realized in a software product. The computer software product is stored in a storage medium, including several commands that enable a computer device (may be a personal computer, a server, or network device) to perform all or part of the steps of the methods of the various embodiments of the present disclosure. The storage medium includes U-disk, removable hard disk, read-only memory (ROM), random access memory (RAM), magnetic disk or compact disc (CD) and other medium that can store program codes.

The above texts are merely specific embodiments of the present disclosure. However, the scope of the present disclosure is not limited hereto. Any variations or alternatives that can easily be thought of by technicians familiar with the field should fall within the scope of the present disclosure. Therefore, the scope of the present disclosure should be defined by the scope of the claims.

What is claimed is:

1. A power adapter comprising:
a first rectifying circuit configured to rectify an input AC power to output voltage in a first pulsating waveform during a charging process;
a second rectifying circuit configured to rectify voltage coupled from a primary side of the adapter to a secondary side of the adapter, wherein waveform of current output after being rectified by the second rectifying circuit has a same period as period of the first pulsating waveform, or an envelope of the waveform of the current output after being rectified by the second rectifying circuit has a same period as period of the first pulsating waveform;
a switch circuit, configured to modulate the voltage in the first pulsating waveform based on a control signal;
a transformer, configured to output voltage in a second pulsating waveform based on the voltage in the first pulsating waveform that is modulated; wherein the second rectifying circuit is configured to rectify the voltage in the second pulsating waveform to output voltage in a third pulsating waveform;
a first charging interface, connected to the second rectifying circuit and configured to apply the voltage in the third pulsating waveform to a battery of a terminal via a second charging interface of the terminal when the first charging interface connected to the second charging interface, wherein the second charging interface connects the battery;
a sampling circuit configured to sample voltage and/or a current output from the second rectifying circuit to obtain a voltage sampling value and/or a current sampling value; and
a control circuit connected to the sampling circuit and the switch circuit, the control circuit outputting the control signal to the switch circuit, and modulating a duty cycle of the control signal based on the voltage sampling value and/or the current sampling value so that the voltage in the third pulsating waveform satisfies a charging requirement;
wherein the control circuit communicates with the terminal through the first charging interface to determine a charging mode, wherein the charging mode comprises a fast charging mode and a normal charging mode;
wherein the power adapter further comprises a controllable switch and a filter circuit connected in series, the serially connected controllable switch and filter circuit being connected to a first output terminal of the second rectifying circuit, wherein the control circuit is further configured to control the controllable switch to close when the charging mode is determined to be the normal charging mode, and control the controllable switch to open when the charging mode is determined to be a fast charging mode.

2. The power adapter as claimed in claim 1, further comprising:
a drive circuit connected between the switch circuit and the control circuit, the drive circuit configured to drive the switch circuit to turn on or turn off based on the control signal.

3. The power adapter as claimed in claim 2, further comprising:
an auxiliary winding generating voltage in a fourth pulsating waveform based on the voltage in the first pulsating waveform that is modulated; and
a power supply circuit connected to the auxiliary winding, the power supply circuit configured to convert the voltage in the fourth pulsating waveform to output a DC power so as to supply power to the drive circuit and/or the control circuit.

4. The power adapter as claimed in claim 3, further comprising:
a first voltage detection circuit connected to the auxiliary winding and the control circuit, the first voltage detection circuit configured to detect the voltage in the fourth pulsating waveform to generate a voltage detection value, wherein the control circuit is further configured to modulate the duty cycle of the control signal based on the voltage detection value.

5. The power adapter as claimed in claim 1, wherein the sampling circuit comprises:
a first current sampling circuit configured to sample a current output from the second rectifying circuit to obtain the current sampling value; and
a first voltage sampling circuit configured to sample voltage output from the second rectifying circuit to obtain the voltage sampling value.

6. The power adapter as claimed in claim 5, wherein the first voltage sampling circuit comprises:
a peak voltage sampling and retaining circuit configured to configured to sample and retain a peak voltage of the voltage in the third pulsating waveform;
a zero-crossing sampling circuit configured to sample zero-crossing points of the voltage in the third pulsating waveform;
a discharge circuit configured to discharge the peak voltage sampling and retaining circuit at the zero-crossing points; and
an analog/digital (AD) sampling circuit configured to sample the peak voltage in the peak voltage sampling and retaining circuit so as to obtain the voltage sampling value.

7. The power adapter as claimed in claim 1, further comprising:
a second voltage sampling circuit configured to sample the voltage in the first pulsating waveform, the second voltage sampling circuit being connected to the control circuit, wherein the control circuit controls the switch circuit to turn on for a first predetermined time so as to discharge when a voltage value sampled by the second voltage sampling circuit is greater than a first predetermined voltage value.

8. The power adapter as claimed in claim 1, wherein the control circuit is further configured to obtain a charging current and/or a charging voltage corresponding to the fast charging mode based on state information of the terminal when the charging mode is determined to be the fast charging mode, and modulate the duty cycle of the control signal based on the charging current and/or the charging voltage corresponding to the fast charging mode.

9. The power adapter as claimed in claim 8, wherein the state information of the terminal comprises a battery temperature, wherein when the battery temperature is higher than a first predetermined threshold temperature or lower than a second predetermined threshold temperature, the fast charging mode is switched to the normal charging mode if a current charging mode is the fast charging mode, wherein the first predetermined threshold temperature is higher the second predetermined threshold temperature.

10. A charging system for a terminal, comprising:
a power adapter as claimed in claim 1; and
a terminal comprising a battery, the battery being charged based on an output voltage of the power adapter.

11. A charging method of charging a terminal via a power adapter, the power adapter comprising a first rectifying circuit and a second rectifying circuit, and the charging method comprising:
rectifying an input alternating current (AC) power to output voltage in a first pulsating waveform during a charging process;
rectifying voltage coupled from a primary side of the power adapter to a secondary side of the power adapter to generate a secondary rectifying signal, wherein a waveform of a current of the secondary rectifying signal has a same period as period of the first pulsating waveform, or an envelope of the current of the secondary rectifying signal has a same period as period of the first pulsating waveform; and
modulating, by controlling a switch circuit, the voltage in the first pulsating waveform to output a modulated voltage, and converting, by a transformer, the modulated voltage into voltage in a second pulsating waveform;
wherein rectifying the voltage coupled from the primary side to the secondary side to generate the secondary rectifying signal comprises:
rectifying the voltage in the second pulsating waveform to output voltage in a third pulsating waveform, and applying the voltage in the third pulsating waveform to a battery of the terminal via a second charging interface of the terminal;
wherein the charging method further comprises:
sampling voltage and/or current of the second rectifying signal to obtain a voltage sampling value and/or a voltage sampling value;
modulating a duty cycle of a control signal that is configured to control the switch circuit based on the voltage sampling value and/or the current sampling value, so that the voltage in the third pulsating waveform satisfies a charging requirement;
communicating with the terminal through a first charging interface to determine a charging mode, wherein the charging mode comprises a fast charging mode and a normal charging mode; and
controlling a controllable switch to close when the charging mode is determined to be the normal charging mode, and control the controllable switch to open when the charging mode is determined to be a fast charging mode, wherein the controllable switch is connected with a filter circuit in series, the serially connected controllable switch and filter circuit are connected to a first output terminal of the second rectifying circuit.

12. The charging method as claimed in claim 11, further comprising:
modulating a frequency of the control signal based on the voltage sampling value and/or the current sampling value.

13. The charging method as claimed in claim 11, further comprising:
communicating with the terminal through the first charging interface to acquire state information of the terminal, so that the duty cycle of the control signal is modulated based on the state information of the terminal, the voltage sampling value and/or the current sampling value.

14. The charging method as claimed in claim 11, further comprising:
generating voltage in a fourth pulsating waveform by a transformer; detecting the voltage in the fourth pulsating waveform to generate a voltage detection value; and modulating the duty cycle of the control signal based on the voltage detection value.

15. The charging method as claimed in claim 11, wherein the sampling the voltage of the second rectifying signal to obtain the voltage sampling value comprises:

sampling and retaining a peak voltage of the voltage of the second rectifying signal, and sampling zero-crossing points of the voltage of the second rectifying signal;

at the zero-crossing points, discharging a peak voltage sampling and retaining circuit that is configured to sample and retain the peak voltage of the voltage of the second rectifying signal; and sampling the peak voltage sampled by the peak voltage sampling and retaining circuit so as to obtain the voltage sampling value.

16. The charging method as claimed in claim 11, further comprising:

turning on the switch circuit for a first predetermined time to discharge when a value obtained by sampling the voltage in the first pulsating waveform is greater than a first predetermined voltage value.

17. The charging method as claimed in claim 13, further comprising:

obtaining a charging current and/or a charging voltage corresponding to the fast charging mode based on the state information of the terminal when the charging mode is determined to be the fast charging mode; and modulating the duty cycle of the control signal based on the charging current and/or the charging voltage corresponding to the fast charging mode.

18. The charging method as claimed in claim 17, wherein the state information of the terminal comprises a battery temperature, wherein when the battery temperature is higher than a first predetermined threshold temperature or lower than a second predetermined threshold temperature, the fast charging mode is switched to the normal charging mode if a current charging mode is the fast charging mode, wherein the first predetermined threshold temperature is higher the second predetermined threshold temperature.

19. The charging method as claimed in claim 13, wherein the state information of the terminal comprises a battery level, a battery temperature, voltage/current of the terminal, interface information of the terminal, or path impedance information of the terminal.

\* \* \* \* \*